US009367255B2

(12) United States Patent
Yun et al.

(10) Patent No.: US 9,367,255 B2
(45) Date of Patent: Jun. 14, 2016

(54) STORAGE DEVICE INCLUDING VARIABLE RESISTANCE MEMORY, FLASH MEMORY AND CONTROLLER

(71) Applicants: Eun-Jin Yun, Seoul (KR); Bogeun Kim, Suwon-si (KR)

(72) Inventors: Eun-Jin Yun, Seoul (KR); Bogeun Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/855,760

(22) Filed: Sep. 16, 2015

(65) Prior Publication Data

US 2016/0004469 A1    Jan. 7, 2016

Related U.S. Application Data

(63) Continuation of application No. 13/803,715, filed on Mar. 14, 2013, now Pat. No. 9,165,657.

(30) Foreign Application Priority Data

Apr. 18, 2012    (KR) .................. 10-2012-0040505

(51) Int. Cl.
| | | |
|---|---|---|
| *G11C 11/00* | (2006.01) | |
| *G11C 11/34* | (2006.01) | |
| *G06F 3/06* | (2006.01) | |
| *G11C 16/10* | (2006.01) | |
| *G11C 11/56* | (2006.01) | |
| *G11C 13/00* | (2006.01) | |
| *G11C 11/16* | (2006.01) | |

(52) U.S. Cl.
CPC ............ *G06F 3/0619* (2013.01); *G06F 3/0655* (2013.01); *G06F 3/0688* (2013.01); *G11C 11/005* (2013.01); *G11C 11/5628* (2013.01); *G11C 11/5678* (2013.01); *G11C 13/0004* (2013.01); *G11C 16/10* (2013.01); *G11C 11/16* (2013.01); *G11C 13/0002* (2013.01)

(58) Field of Classification Search
USPC ............... 365/148, 158, 163, 185.09, 185.12, 365/185.17, 185.18, 185.24, 185.33
See application file for complete search history.

(56) References Cited

U.S. PATENT DOCUMENTS

| | | | |
|---|---|---|---|
| 6,801,471 | B2 | 10/2004 | Viehmann et al. |
| 7,523,274 | B2 | 4/2009 | Ryu et al. |
| 7,764,551 | B2 | 7/2010 | Seo et al. |
| 7,787,297 | B2 | 8/2010 | Jeon et al. |
| 7,916,538 | B2 | 3/2011 | Jeon et al. |
| 8,139,406 | B2 | 3/2012 | Park et al. |

(Continued)

FOREIGN PATENT DOCUMENTS

| | | |
|---|---|---|
| KR | 100843209 B1 | 5/2008 |
| KR | 100888823 B1 | 12/2008 |
| KR | 100909902 B1 | 7/2009 |

*Primary Examiner* — Trong Phan
(74) *Attorney, Agent, or Firm* — Volentine & Whitt, PLLC

(57) ABSTRACT

A storage device includes a variable resistance memory, a flash memory and a controller. The flash memory includes a plurality of memory cells connected to a plurality of word lines. The controller is configured to receive data from an external device and program the received data in the variable resistance memory or the flash memory according to a quantity of data to be programmed in the flash memory. Further, the controller is configured to read from the variable resistance memory and program the read data in the flash memory, when the quantity of data accumulated in the variable resistance memory corresponds to a super page of data.

20 Claims, 25 Drawing Sheets

(56) References Cited

U.S. PATENT DOCUMENTS

| | | |
|---|---|---|
| 8,174,876 B2 | 5/2012 | Lee |
| 8,320,160 B2 | 11/2012 | Nazarian |
| 8,339,833 B2 | 12/2012 | Tokiwa et al. |
| 8,355,280 B2 | 1/2013 | Yoon et al. |
| 8,369,151 B2 | 2/2013 | Yoneya et al. |
| 8,665,643 B2 | 3/2014 | Kim et al. |
| 8,711,610 B2 | 4/2014 | Seo et al. |
| 8,812,933 B2 | 8/2014 | Joo et al. |
| 8,873,290 B2 | 10/2014 | Cho et al. |
| 8,934,301 B2 | 1/2015 | Yun |
| 2007/0130442 A1 | 6/2007 | Lee et al. |
| 2008/0123391 A1 | 5/2008 | Cho et al. |
| 2008/0291727 A1 | 11/2008 | Seo et al. |
| 2009/0003066 A1 | 1/2009 | Park et al. |
| 2010/0214813 A1 | 8/2010 | Choi et al. |
| 2010/0293323 A1 | 11/2010 | Jeon et al. |

Fig. 3

Page Program Sequence

| WL5 | 10 |    |    | ← Super page |
| --- | -- | -- | -- | ------------ |
| WL4 | 7  | 11 |    | ← Super page |
| WL3 | 4  | 8  | 12 | ← Super page |
| WL2 | 2  | 5  | 9  | ← Super page |
| WL1 | 1  | 3  | 6  | ← Super page |

Fig. 4

| | Threshold condition |
|---|---|
| WL5 | |
| WL4 | |
| WL3 | Accumulation of page data corresponding to page program sequence 10 to 12 |
| WL2 | Accumulation of page data corresponding to page program sequence 7 to 9 |
| WL1 | Accumulation of page data corresponding to page program sequence 1 to 6 |

Fig. 5

Page Program Sequence

| WL5 | 13 | 14 | 15 | ← Super page |
| WL4 | 10 | 11 | 12 | ← Super page |
| WL3 | 7 | 8 | 9 | ← Super page |
| WL2 | 4 | 5 | 6 | ← Super page |
| WL1 | 1 | 2 | 3 | ← Super page |

Fig. 6

| | Threshold condition |
|---|---|
| WL5 | |
| WL4 | |
| WL3 | Accumulation of page data corresponding to page program sequence 7 to 9 |
| WL2 | Accumulation of page data corresponding to page program sequence 4 to 6 |
| WL1 | Accumulation of page data corresponding to page program sequence 1 to 3 |

STORAGE DEVICE INCLUDING VARIABLE RESISTANCE MEMORY, FLASH MEMORY AND CONTROLLER

CROSS-REFERENCE TO RELATED APPLICATIONS

This is a continuation of U.S. application Ser. No. 13/803,715, filed Mar. 14, 2013, which issued as U.S. Pat. No. 9,165,657, on Oct. 20, 2015, and in which a claim for priority under 35 U.S.C. §119 is made to Korean Patent Application No. 10-2012-0040505 filed Apr. 18, 2012, in the Korean Intellectual Property Office, the entire contents of which are hereby incorporated by reference.

BACKGROUND

The inventive concepts described herein generally relate to semiconductor memories, and more particularly, to an operating method of a memory system which includes a NAND flash memory, a variable resistance memory, and a controller.

A semiconductor memory device is a data storage device which is fabricated using semiconductors such as silicon (Si), germanium (Ge), gallium arsenide (GaAs), indium phosphide (InP), and the like. Semiconductor memory devices are generally classified as either volatile memory devices or nonvolatile memory devices.

The volatile memory devices are generally characterized by the loss of stored contents upon a power-off state. Some examples of volatile memory devices include static RAM (SRAM), dynamic RAM (DRAM), synchronous DRAM (SDRAM), and the like. In contrast, nonvolatile memory devices are generally characterized by the retention of stored contents when power is turned off or otherwise disconnected. Examples of nonvolatile memory devices include read only memory (ROM), programmable ROM (PROM), electrically programmable ROM (EPROM), electrically erasable and programmable ROM (EEPROM), flash memory device, phase-change RAM (PRAM), magnetic RAM (MRAM), resistive RAM (RRAM), ferroelectric RAM (FRAM), and the like. Among these, flash memory is typically configured as either NOR type flash memory or a NAND type flash memory.

SUMMARY

Example embodiments of the inventive concept provide an operating method of a memory system, where the memory system includes a NAND flash memory, a resistance variable memory, and a controller controlling the NAND flash memory and the resistance variable memory. The method includes receiving data, programming the received data in the NAND flash memory when the received data is at least a super page of data, programming the received data in the resistance variable memory when the received data is not a super page of data, and programming data accumulated in the resistance variable memory in the NAND flash when the data accumulated in the resistance variable memory is a super page of data. A super page of data is an entirety of data that is programmable in memory cells connected to a same word line of the NAND flash memory.

Other embodiments of the inventive concept provide an operating method of a memory systems, where the memory system includes a NAND flash memory, a resistance variable memory, and a controller controlling the NAND flash memory and the resistance variable memory, where the NAND flash memory is configured to store N bits of data per memory cell, and N pages of data per word line of each memory block, and where N is two or more. The method includes receiving data, programming the received data in the NAND flash memory when the received data is at least N pages of data, programming the received data in the resistance variable memory when the received data is less than N pages of data, and programming accumulated data programmed in the resistance variable memory in the NAND flash memory when the accumulated data is at least N pages of data.

Still other example embodiments of the inventive concept provide an operating method of a memory system, where the memory system includes a NAND flash memory, a resistance variable memory, and a controller controlling the NAND flash memory and the resistance variable memory. The method includes receiving data, programming the received data in the resistance variable memory, and programming a super page of data among data accumulated in the resistance variable memory in NAND flash memory when a free capacity of the resistance variable memory reaches a threshold value. A super page of data is an entirety of data that is programmable in memory cells connected to a same word line of the NAND flash memory.

BRIEF DESCRIPTION OF THE FIGURES

The above and other objects and features will become apparent from the description that follows with reference to the accompanying figures, wherein like reference numerals refer to like parts throughout the various figures unless otherwise specified.

FIG. 3 is a diagram illustrating a program sequence of a NAND flash memory according to an embodiment of the inventive concept.

FIG. 4 is a diagram illustrating an operating method of FIG. 2 executed according to the program sequence shown in FIG. 3.

FIG. 5 is a diagram illustrating a program sequence of a NAND flash memory according to another embodiment of the inventive concept.

FIG. 6 is a diagram illustrating an operating method of FIG. 2 executed according to the program sequence shown in FIG. 5.

DETAILED DESCRIPTION

Figure 1:
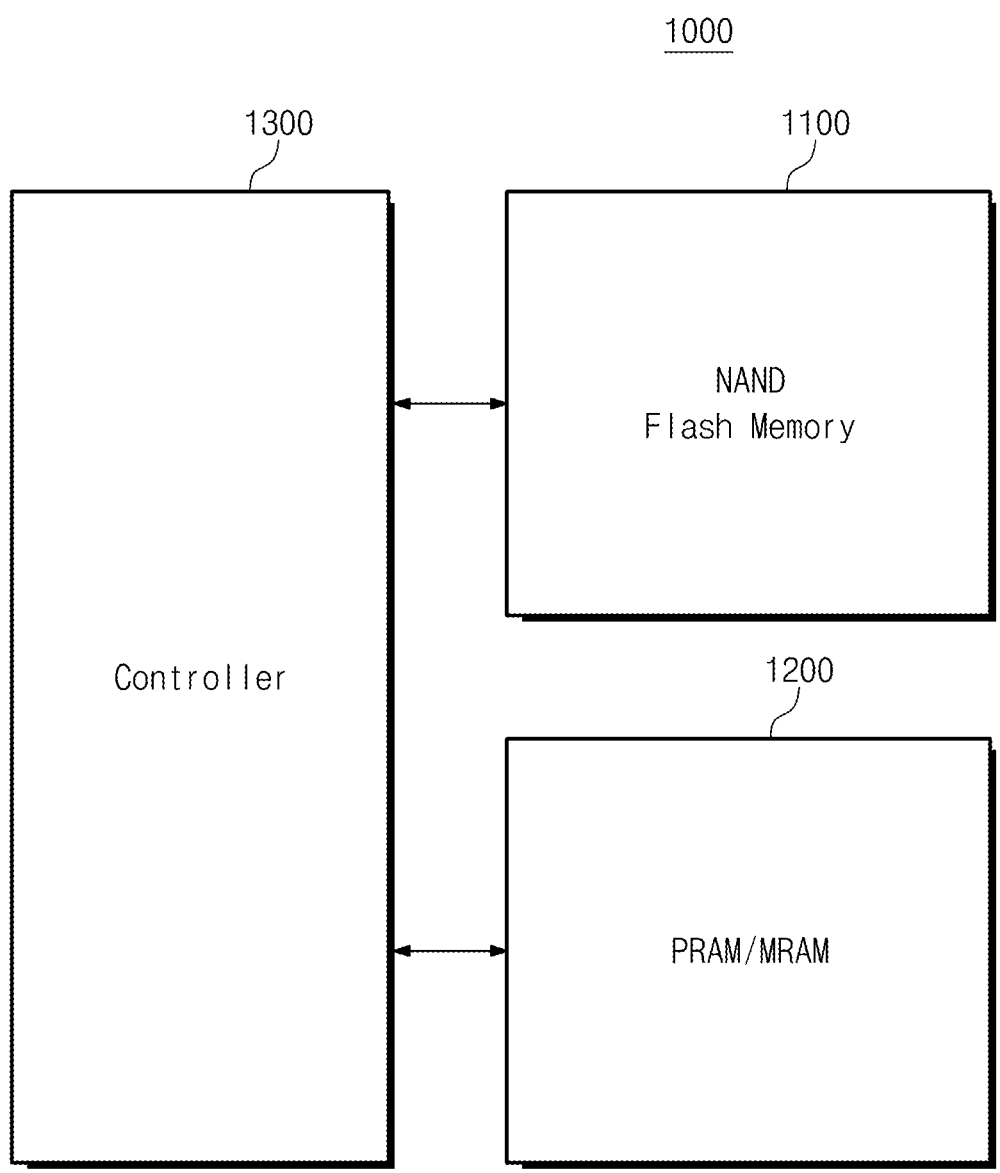
FIG. 1 is a block diagram schematically illustrating a memory system according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a memory system according to an embodiment of the inventive concept. Referring to FIG. 1, a memory system 1000 may include a NAND flash memory 1100, a phase change memory 1200, and a controller 1300.

The NAND flash memory 1100 may perform program, read, and erase operations under control of the controller 1300. The NAND flash memory 1100 may be configured to store multi-bit data in each memory cell thereof.

Generally, the operational characteristic of the NAND flash memory 1100 differ from those of a random access memory (RAM). For example, the NAND flash memory 1100 may have an erase-before-write characteristic, i.e., the memory cells are erased before being written or programmed. Also, a program unit and/or read unit of the NAND flash memory 1100 may be of a different unit memory size than an erase unit of the NAND flash memory 1100. Here, a "unit" denotes memory cells which may be programmed, read or erased at the same time.

For example, a program unit and/or read unit of the NAND flash memory 1100 may be a page of memory. A page may be formed of memory cells connected with a same word line of the NAND flash memory 1100. In the event that memory cells of the NAND flash memory 1100 are arranged in three dimensions, memory cells arranged in two dimensions along rows and columns may be commonly connected to a same word line. In this case, a page constituting a program or read unit may be formed of a row of memory cells or a column of memory cells from among the two dimensionally arranged memory cells commonly connected to the same word line.

An erase unit of the NAND flash memory 1100 may be a memory block. The memory block may include memory cells connected to a plurality of word lines. Thus, a size of the memory block which constitutes an erase unit may be larger than the size of a page constituting a program unit and/or read unit.

The phase change memory 1200 may perform program, read, and erase operations under control of the controller 1300. The phase change memory 1200 may be configured to store a single bit or multiple bits per memory cell. The phase change memory 1200 may be a random access memory, and may not have an erase-before-write characteristic. Instead, the phase change memory 1200 may support an overwrite function. Before memory cells connected with a word line are erased, the phase change memory 1200 may program the memory cells several times. That is, the phase change memory 1200 may provide a plural NOP (number of program).

The phase change memory 1200 may be a phase change RAM (PRAM) including memory cells each having a crystal state or an amorphous state. However, this is just an example, and other types of resistance variable memories may be utilized instead, such as a magnetic RAM (MRAM) including memory cells having a parallel magnetic state or an antiparallel magnetic state.

The controller 1300 may be configured to control the NAND flash memory 1100 and the phase change memory 1200. A physical address system of the NAND flash memory 1100 may be different from a logical address system of a host due at least in part to the above-described erase-before-write characteristic of the NAND flash memory 1100. The controller 1300 may interconvert the logical address system of the host and the physical address system of the NAND flash memory 1100.

The controller 1300 may control an erase operation of the NAND flash memory 1100. The controller 1300 may process data, established to be erased at a host, as invalid data. In an idle state, the controller 1300 may make a programmable memory block by erasing a memory block in which invalid data is stored.

The controller 1300 may use the NAND flash memory 1100 as a mass storage device and the phase change memory 1200 as a buffer memory. As described above, the phase change memory 1200 may be accessed randomly and overwritten. The controller 1300 may temporarily store data received from a host at the phase change memory 1200, and may copy data stored at the phase change memory 1200 to be stored at the NAND flash memory 1100.

Figure 2:
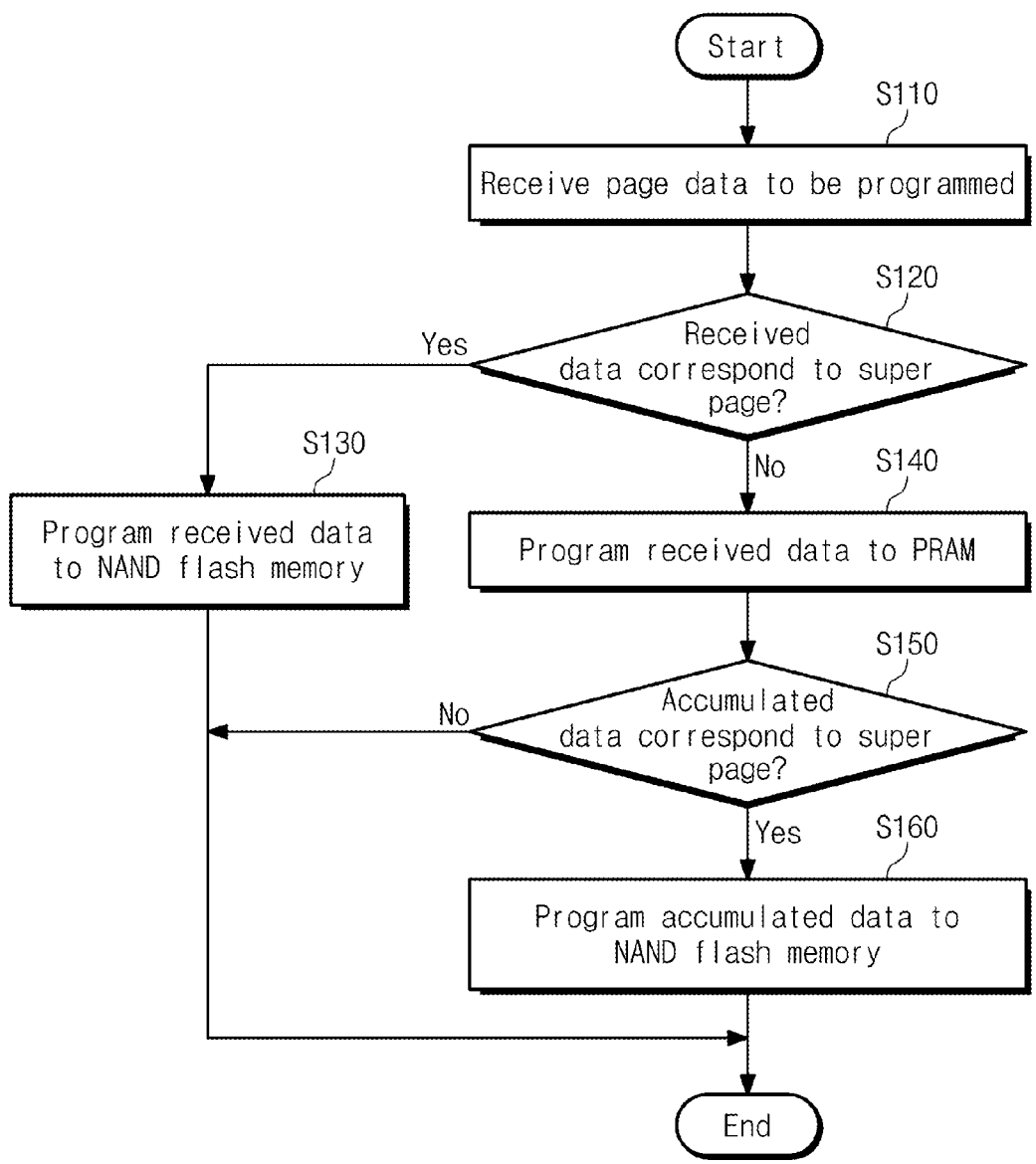
FIG. 2 is a flowchart illustrating an operating method of a memory system according to an embodiment of the inventive concept.

FIG. 2 is a flowchart illustrating an operating method of a memory system according to an embodiment of the inventive concept. Referring to FIGS. 1 and 2, in operation S110, a memory system 1000 may receive data to be programmed. For example, a controller 1300 may receive data to be programmed from an external host.

In operation S120, a judgment is made as whether the input data corresponds to a super page. This judgment may be made by the controller 1300. The super page constitutes at least a quantity of data to be programmed in all of the programmable memory cells connected with a same word line. The super page can include two or more bits to be programmed at each of memory cells connected with the same word line. Also, the super page may further include at least one bit to be programmed at each of memory cells connected with a word line adjacent to the word line.

When the input data corresponds to the super page, in operation S130, the input data may be programmed at a NAND flash memory 1100. The controller 1300 may control the NAND flash memory 1100 to program the input data.

When the input data does not correspond to the super page, for example, when the input data is smaller in size than the super page, in operation S140, the input data may be programmed at a phase change memory 1200. The controller 1300 may control the phase change memory 1200 to program the input data.

For example, when a part of the input data corresponds to the super page and the rest thereof does not correspond to the super page, the controller 1300 data, corresponding to the super page, from among the input data at the NAND flash memory 1100 and the rest thereof at the phase change memory 1200.

In operation S150, whether data accumulated at the phase change memory 1200 corresponds to the super page may be judged. The controller 1300 may judge whether data accumulated at the phase change memory 1200 corresponds to the super page.

When the data accumulated at the phase change memory 1200 corresponds to the super page, in operation S160, the accumulated data may be programmed at the NAND flash memory 1100. The controller 1300 may control the NAND flash memory 1100 and the phase change memory 1200 such that data, corresponding to the super page, from among data accumulated at the phase change memory 1200 is programmed at the NAND flash memory 1100.

FIG. 3 is a diagram illustrating a program sequence of a NAND flash memory according to an embodiment of the inventive concept. In FIG. 3, there is exemplarily illustrated an example that three bits are stored at a memory cell. However, the inventive concept is not limited thereto.

Referring to FIGS. 1 to 3, a first program operation "1" may be performed with respect to a first word line WL1 of a NAND flash memory 1100. For example, least significant bits may be programmed at memory cells connected with the first word line WL1.

A second program operation "2" may be performed with respect to a second word line WL2 adjacent to the first word line WL1. Least significant bits may be programmed at memory cells connected with the second word line WL2.

A third program operation "3" may be performed with respect to the first word line WL1. Central significant bits may be programmed at memory cells connected with the first word line WL1.

A fourth program operation "4" may be performed with respect to a third word line WL3 adjacent to the second word line WL2. Least significant bits may be programmed at memory cells connected with the third word line WL3.

A fifth program operation "5" may be performed with respect to the second word line WL2. Central significant bits may be programmed at memory cells connected with the second word line WL2.

A sixth program operation "6" may be performed with respect to the first word line WL1. Most significant bits may be programmed at memory cells connected with the first word line WL1.

A seventh program operation "7" may be performed with respect to a fourth word line WL4 adjacent to the third word line WL3. Least significant bits may be programmed at memory cells connected with the fourth word line WL4.

An eighth program operation "8" may be performed with respect to the third word line WL3. Central significant bits may be programmed at memory cells connected with the third word line WL3.

A ninth program operation "9" may be performed with respect to the second word line WL2. Most significant bits may be programmed at memory cells connected with the second word line WL2. In FIG. 3, "10", "11" and "12" denote tenth, eleventh and twelfth program operations, respectively.

With the above description, a program operation may be alternately performed at adjacent word lines WL1 to WL5. Before central significant bits are programmed at memory cells connected to the first word line WL1, least significant bits may be programmed at memory cells connected with a second word line WL2 adjacent to the first word line WL1. Before most significant bits are programmed at memory cells connected to the first word line WL1, central significant bits may be programmed at memory cells connected with the second word line WL2 adjacent to the first word line WL1.

In example embodiments, data needed to complete programming of memory cells connected with a word line (or, a program or read unit of memory cells) may form a super page. When each of memory cells connected with a word line stores three bits, the super page may include 3-bit data stored at each of memory cells connected with the word line. Until programming of memory cells connected with a word line is completed, the super page may further include data to be programmed at memory cells connected with a word line adjacent to the word line.

FIG. 4 is a diagram illustrating an operating method shown in FIG. 2 executed according to a program sequence shown in FIG. 3. Referring to FIGS. 1 to 4, the condition that data accumulated at a phase change memory 1200 is transferred to a NAND flash memory 1100 may be established according to a super page.

Three pages of data (program sequence 1, 3, 6) to be programmed at memory cells of a first word line WL1, two pages of data (program sequence 2 and 5) to be programmed at memory cells of a second word line WL2, and one page of data (program sequence 4) to be programmed at memory cells of a third word line WL3 may be required to complete programming of memory cells connected with the first word line WL1. When data needed to complete programming of memory cells connected with the first word line WL1 is accumulated, the accumulated data may be transferred to the NAND flash memory 1100. This threshold condition is referred to in FIG. 4 as "Accumulation of page data corresponding to page program sequence 1 to 6."

If programming of the memory cells connected with the first word line WL1 is completed, least significant bits and central significant bits may be programmed at memory cells connected with the second word line WL2. At this state, one page of data (program sequence 7) to be programmed at memory cells of a fourth word line WL4, one page of data (program sequence 7) to be programmed at memory cells of the third word line WL3, and one page of data (program sequence 9) to be programmed at memory cells of the second word line WL2 may be required to complete programming of memory cells connected with the second word line WL2. When data needed to complete programming of memory cells connected with the second word line WL2 is accumulated, the accumulated data may be transferred to the NAND flash memory 1100. This threshold condition is referred to in FIG. 4 as "Accumulation of page data corresponding to page program sequence 7 to 9."

When programming of the memory cells connected with the second word line WL2 is completed, least significant bits and central significant bits may be programmed at memory cells connected with the third word line WL3. At this state, one page of data (program sequence 10) to be programmed at memory cells of a fifth word line WL5, one page of data (program sequence 11) to be programmed at memory cells of the fourth word line WL4, and one page of data (program sequence 12) to be programmed at memory cells of the third word line WL3 may be required to complete programming of memory cells connected with the third word line WL3. When data needed to complete programming of memory cells connected with the third word line WL3 is accumulated, the accumulated data may be transferred to the NAND flash memory 1100. This threshold condition is referred to in FIG. 4 as "Accumulation of page data corresponding to page program sequence 10 to 12."

In example embodiments, a super page may be used as the condition that data input from an external device is directly programmed at the NAND flash memory 1100, not programmed at the phase change memory 1200. When data input from an external device corresponds to a super page, the input data may be directly programmed at the NAND flash memory 1100. When data input from an external device does not correspond to a super page, for example, when data input from an external device is smaller in size than a super page, the input data may be programmed at the phase change memory 1200.

FIG. 5 is a diagram illustrating a program sequence of a NAND flash memory according to another embodiment of the inventive concept. In FIG. 5, there is exemplarily illustrated an example that three bits are stored in a memory cell in a NAND flash memory 1100. However, the inventive concept is not limited thereto. Also, similar to FIG. 3, the numbers 1, 2, 3, 4, 5, 6, 7, 8, 9, 10, 11, 12, 13, 14 and 15 denote the first through fifteenth program operations of the program sequence, respectively.

Referring to FIGS. 1, 2, and 5, first to third program operations may be performed with respect to a first word line WL1 of the NAND flash memory 1100. Fourth to sixth program operations may be performed with respect to a second word line WL2 of the NAND flash memory 1100. Seventh to ninth program operations may be performed with respect to a third word line WL3 of the NAND flash memory 1100. $10^{th}$ to $12^{th}$ program operations may be performed with respect to a fourth word line WL4 of the NAND flash memory 1100. $13^{th}$ to $15^{th}$ program operations may be performed with respect to a fifth word line WL5 of the NAND flash memory 1100.

In FIG. 5, a program operation may be performed by a word line unit. After memory cells connected with a word line, memory cells connected with a word line adjacent to the word line may be programmed. That is, page data programmed at memory cells connected with a word line (or, memory cells belonging to a program or read unit) may form a super page. For example, in the case of an MLC NAND flash memory configured to store N bits of data per memory cell, and N pages of data per word line of each memory block, a super page is constituted by N pages of data. Here, N is two or more. Thus, in this case, when three bits are stored in each memory cell, three pages of data form a super page.

FIG. 6 is a diagram illustrating an operating method in FIG. 2 executed according to a program sequence in FIG. 5. Referring to FIGS. 1, 2, 5, and 6, a super page may be used to establish a condition that data accumulated at a phase change memory 1200 is transferred to the NAND flash memory 1100.

Three pages of data (program sequence 1, 2, and 3) to be programmed at memory cells connected with a first word line WL1 may be required to complete programming of memory cells connected with the first word line WL1. When three pages of data (program sequence 1, 2, and 3) to be programmed at memory cells connected with the first word line WL1 are accumulated at the phase change memory 1200, the accumulated data may be sent to the NAND flash memory 1100. This threshold condition is referred to in FIG. 6 as "Accumulation of page data corresponding to page program sequence 1 to 3."

Three pages of data (program sequence 4, 5, and 6) to be programmed at memory cells connected with a second word line WL2 may be required to complete programming of memory cells connected with the second word line WL2. When three pages of data (program sequence 4, 5, and 6) to be programmed at memory cells connected with the second word line WL2 are accumulated at the phase change memory 1200, the accumulated data may be sent to the NAND flash memory 1100. This threshold condition is referred to in FIG. 6 as "Accumulation of page data corresponding to page program sequence 4 to 6."

Three pages of data (program sequence 7, 8, and 9) to be programmed at memory cells connected with a third word line WL3 may be required to complete programming of memory cells connected with the third word line WL3. When three pages of data (program sequence 7, 8, and 9) to be programmed at memory cells connected with the third word line WL3 are accumulated at the phase change memory 1200, the accumulated data may be sent to the NAND flash memory 1100. This threshold condition is referred to in FIG. 6 as "Accumulation of page data corresponding to page program sequence 7 to 9."

As described with reference to FIGS. 3 to 6, when data (data corresponding to a super page) required to complete programming of memory cells connected with a word line is received from an external device, the received data may be directly programmed at the NAND flash memory 1100. On the other hand, when data smaller in size than the super page is received, the received data may be programmed at the phase change memory 1200. Also, when data accumulated at the phase change memory 1200 corresponds to the super page, the accumulated data may be transferred to the NAND flash memory 1100 to be programmed.

At programming of a conventional NAND flash memory, when first page data is received, it may be programmed as least significant bits of a super page. When second page data is received, it may be programmed as central significant bits of the super page. At this time, the first page data programmed as the least significant bits may be read out from the NAND flash memory 1100, and a program operation may be performed using the read first page data and the input second page data. When third page data is received, it may be programmed as most significant bits of the super page. At this time, the first and second page data programmed as the least significant bits and the central significant bits may be read out from the NAND flash memory 1100, and a program operation may be performed using the read first and second page data and the input third page data.

With an embodiment of the inventive concept, when data (corresponding to a super page) required for program completion of memory cells connected with a word line of the NAND flash memory 1100 is accumulated at the phase change memory 1200, the accumulated data may be programmed at the NAND flash memory 1100. Thus, an operating speed of the memory system 1000 may be improved by skipping operations for reading data, programmed at least significant bits and central significant bits, from the NAND flash memory 1100. Also, a threshold voltage distribution of programmed memory cells may be improved by ending programming of memory cells connected with a word line at a time.

Figure 7:
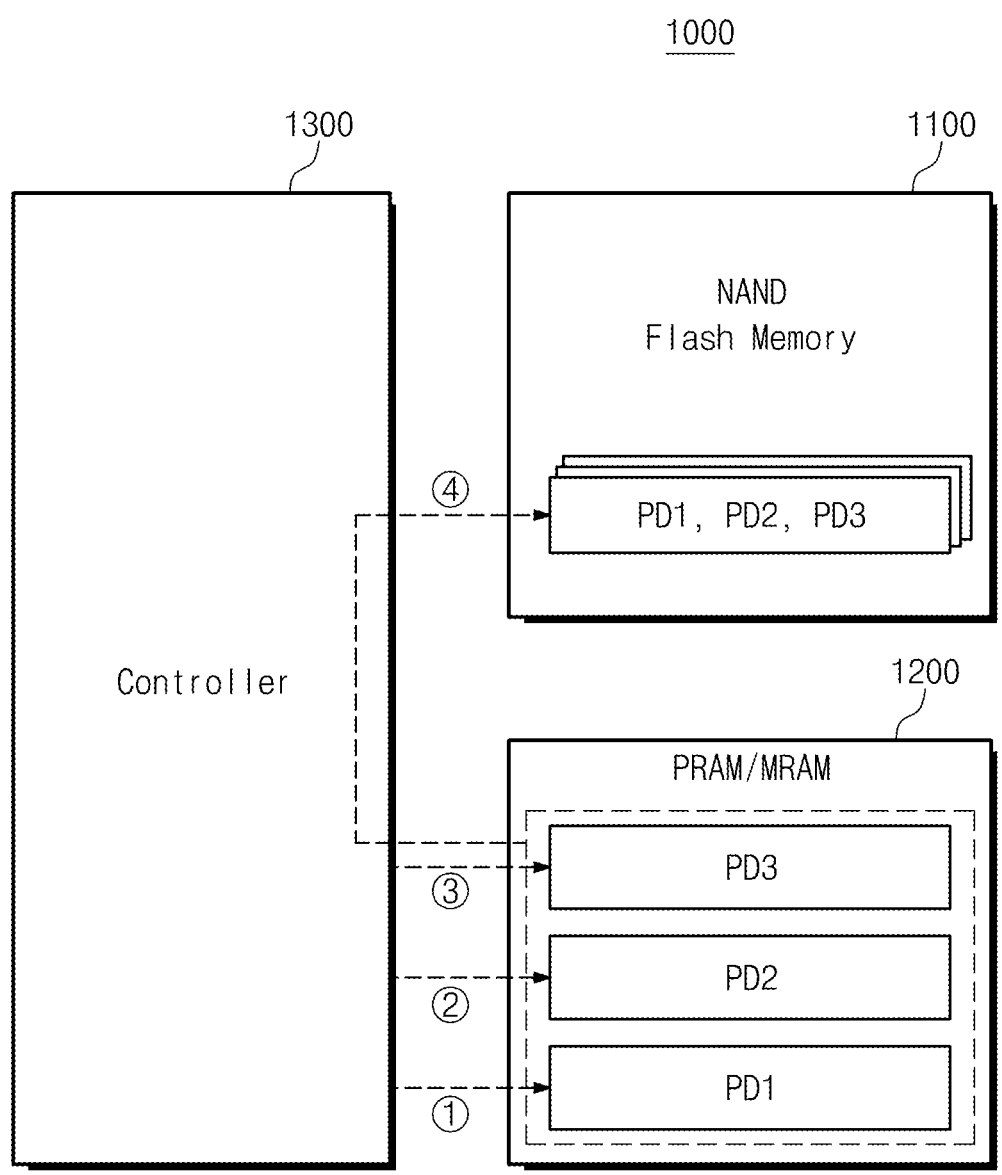
FIG. 7 is a diagram illustrating an operating method of FIG. 2 executed in a memory system according to an embodiment of the inventive concept.

FIG. 7 is a diagram illustrating an operating method in FIG. 2 executed in a memory system according to an embodiment of the inventive concept. It is assumed that a NAND flash memory 1100 has a program sequence described with reference to FIG. 5.

Referring to FIG. 7, a respectively represented by circle-1, circle-2 and circle-3, first to third pages of data PD1 to PD3 may be sequentially received from an external host. The first to third pages of data PD1 to PD3 may be accumulated at a phase change memory 1200. In example embodiments, the first to third pages of data PD1 to PD3 may correspond to a super page of a NAND flash memory 1100. That is, if the first to third pages of data PD1 to PD3 are accumulated at the phase change memory 1200, they may be programmed at the NAND flash memory 1100 as represented by circle-4 of FIG. 7.

Figure 8:
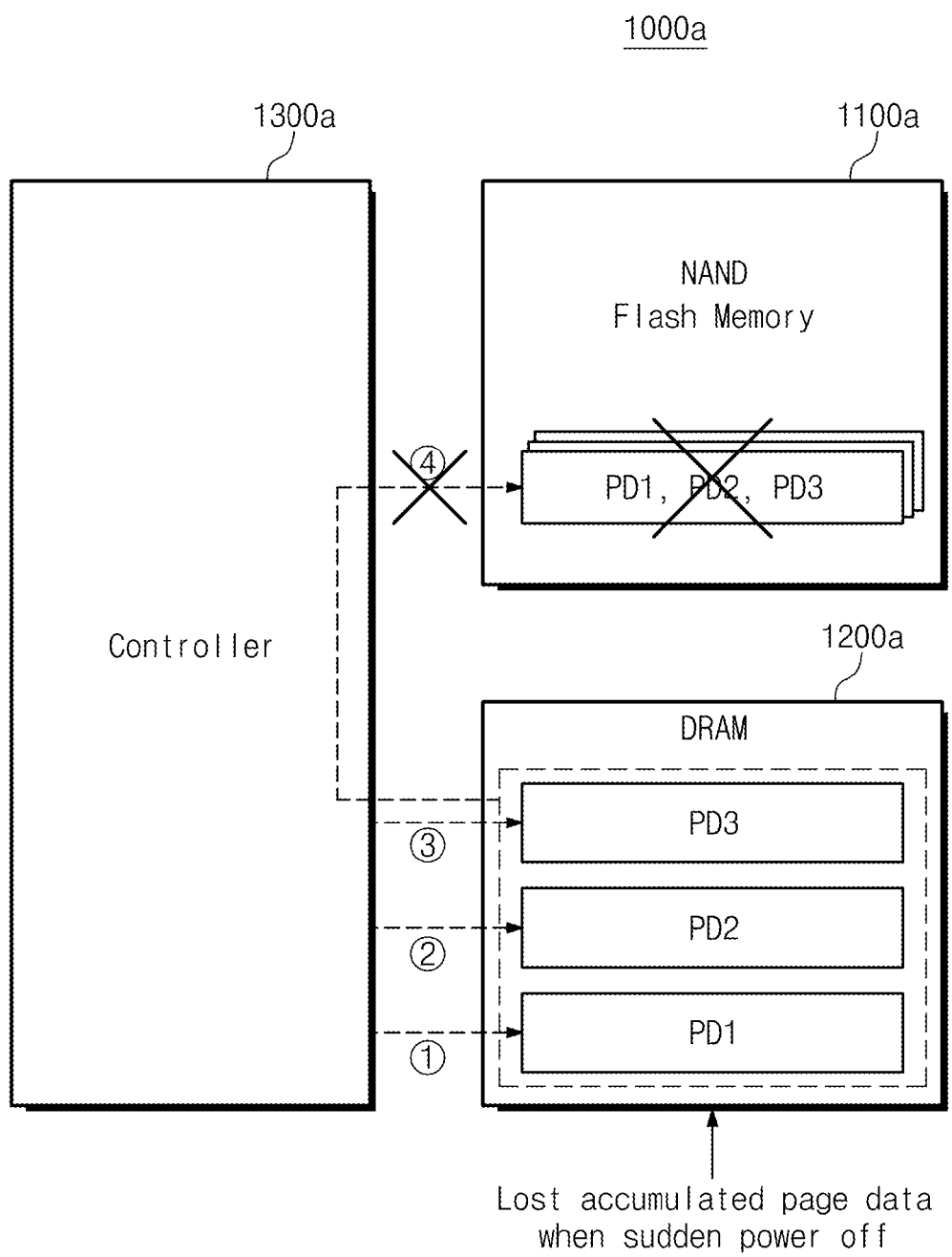
FIG. 8 is a diagram illustrating an operating method of FIG. 2 executed in a memory system including a DRAM instead of a phase change memory according to an embodiment of the inventive concept.

FIG. 8 is a diagram illustrating an operating method in FIG. 2 executed in a memory system including a DRAM instead of a phase change memory according to an embodiment of the inventive concept. It is assumed that a NAND flash memory 1100 has a program sequence described with reference to FIG. 5.

Referring to FIG. 8, a memory system 1000a may include a NAND flash memory 1100a, a DRAM 1200a, and a controller 1300a. As respectively represented by circle-1, circle-2 and circle-3, first to third pages of data PD1 to PD3 provided to the controller 1300a may be accumulated at the DRAM 1200a. If the first to third pages of data PD1 to PD3 accumulated at the DRAM 1200a correspond to a super page, they may be programmed at the NAND flash memory 1100a as represented by circle-4 of FIG. 8.

The DRAM 1200a may be a volatile memory which loses data stored therein at power-off. That is, upon sudden power-off of the memory system 1000a, the first to third pages of data PD1 to PD3 accumulated at the DRAM 1200a may be lost ("lost accumulated page data when sudden power off" in FIG. 8). That is, as represented by "x" and "X" in FIG. 8, it is impossible to transfer the first to third pages of data PD1 to PD3 accumulated at the DRAM 1200a into the NAND flash memory 1100. That is, a memory system 1000 including a phase change memory 1200 being a nonvolatile memory may be more reliable than the memory system 1000a including the DRAM 1200a being a volatile memory.

A device or algorithm for coping with the sudden power-off can be provided to the memory system 1000a having the DRAM 1200a. However, such additional device or algorithm may cause an increase in complexity, cost, and power consumption of the memory system 1000a. Thus, compared with the memory system 1000a having the DRAM 1200a, the memory system 1000 including the phase change memory 1200 being a nonvolatile memory may reduce complexity, cost, and power consumption.

Figure 9:
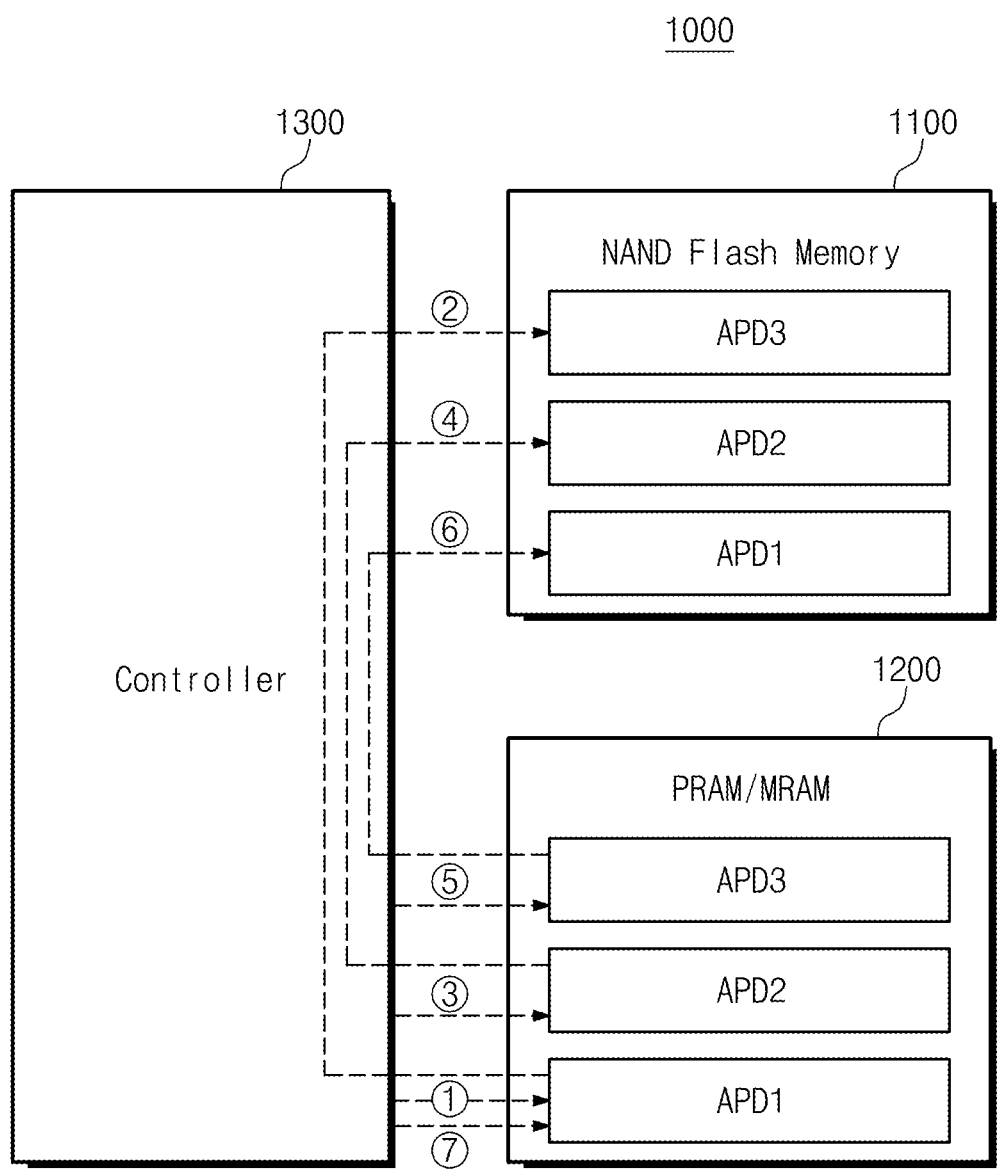
FIG. 9 is a diagram illustrating another example of an operating method of FIG. 2 executed in a memory system according to an embodiment of the inventive concept.

FIG. 9 is a diagram illustrating another example of an operating method in FIG. 2 executed in a memory system according to an embodiment of the inventive concept. Referring to FIG. 9, at circle-1 and circle-2, a first accumulated page of data APD1 at a phase change memory 1200 may be transferred and programmed at a NAND flash memory 1100. At circle-3 and circle-4, second accumulated page of data APD2 at the phase change memory 1200 may be transferred and programmed at the NAND flash memory 1100. At circle-5 and circle-6, third accumulated page of data APD3 at the phase change memory 1200 may be transferred and programmed at the NAND flash memory 1100.

In example embodiments, the first to third accumulated pages of data APD1 to APD3 may be successively received data. The phase change memory 1200 can be filled by the first to third accumulated pages of data APD1 to APD3.

Afterward, as represented by circle-7 of FIG. 9, the rest of data can be continuously received. Since the phase change memory 1200 is over-writable, the rest of data successively received may be overwritten at a storage area that data transferred to the NAND flash memory 1100 was stored.

Figure 10:
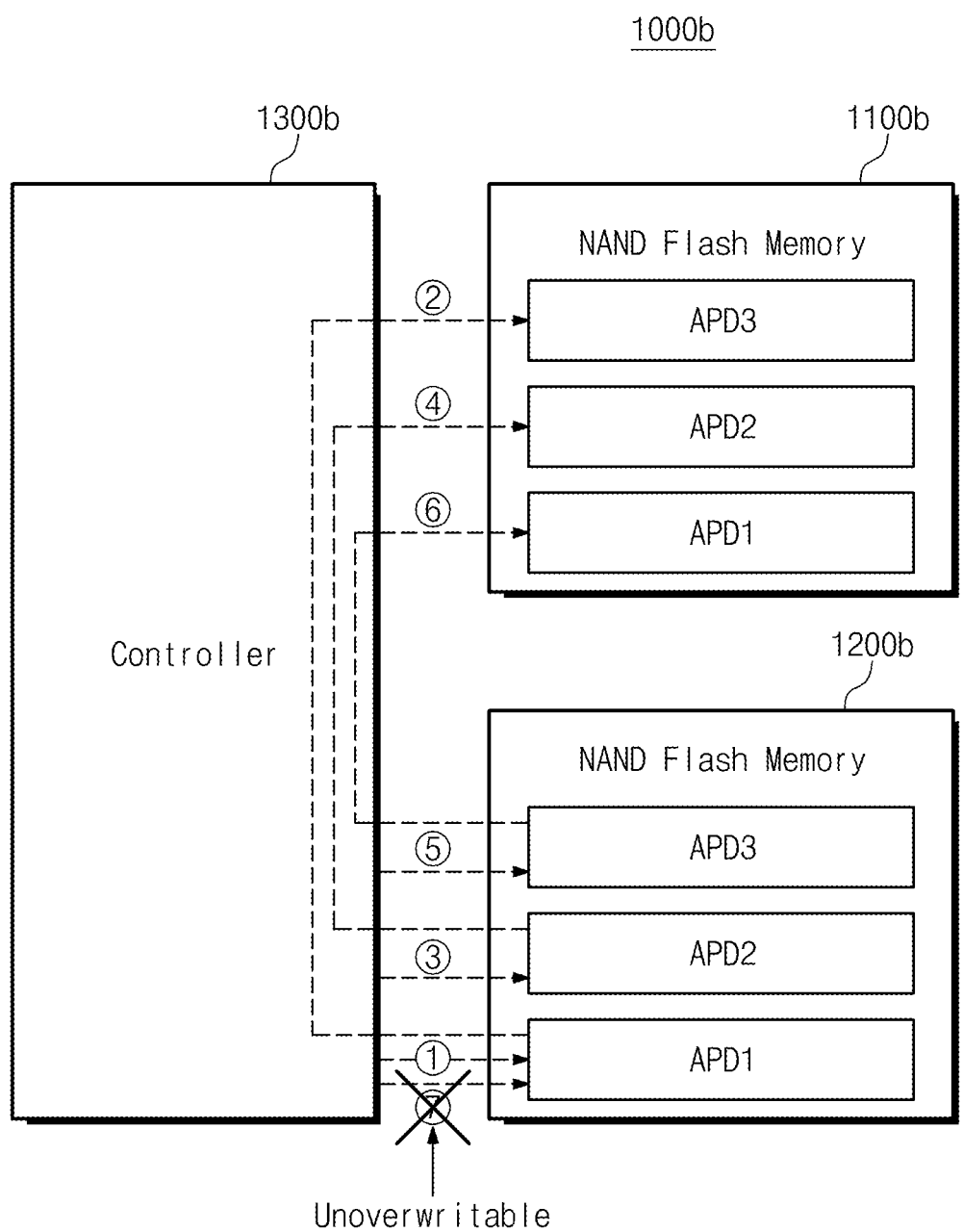
FIG. 10 is a diagram illustrating an operating method of FIG. 2 executed in a memory system including a NAND flash memory instead of a phase change memory according to an embodiment of the inventive concept.

FIG. 10 is a diagram illustrating an operating method in FIG. 2 executed in a memory system including a NAND flash memory instead of a phase change memory according to an embodiment of the inventive concept. Referring to FIG. 10, a memory system 1000b may include NAND flash memories 1100b and 1200b and a controller 1300b.

At circle-1 and circle-2, first accumulated page of data APD1 at the NAND flash memory 1200b may be transferred and programmed at a NAND flash memory 1100b. At circle-3 and circle-4 second accumulated page of data APD2 at the NAND flash memory 1200b may be transferred and programmed at the NAND flash memory 1100b. At circle-5 and circle-6 third accumulated page of data APD3 at the NAND flash memory 1200b may be transferred and programmed at the NAND flash memory 1100b.

In example embodiments, the first to third accumulated pages of data APD1 to APD3 may be successively received data. The NAND flash memory 1200b can be filled by the first to third accumulated pages of data APD1 to APD3.

Afterward, the remainder of the data can be continuously received as represented by circle-7 in FIG. 10. However, as represented by the "X" and "Unoverwritable" in FIG. 10, the NAND flash memory 1200b may not be overwritten. That is, the NAND flash memory 1200b may have an erase-before-write characteristic. Thus, the NAND flash memory 1200b may be erased in advance to program the remainder of data continuously received. This may cause a lowering of an operating speed of the memory system 1000b. In other words, since programming of the remainder of the data is not completed within a response time, an error may arise. A memory system 1000 having an over-writable phase change memory 1200 may exhibit improved operating speed and reliability compared with a memory system 1000b having a NAND flash memory not supporting an overwrite function.

A situation necessitating an erase operation may be prevented by increasing a capacity of the NAND flash memory 1200b. However, this approach may cause an increase in an area of the memory system 1000b as well as an increase in a fabricating cost thereof. Thus, compared with a memory system 1000b having a NAND flash memory 1200b not supporting the overwrite function, the memory system 1000 having the over-writable phase change memory 1200 may be advantageous to reduce an device area and a fabricating cost.

Figure 11:
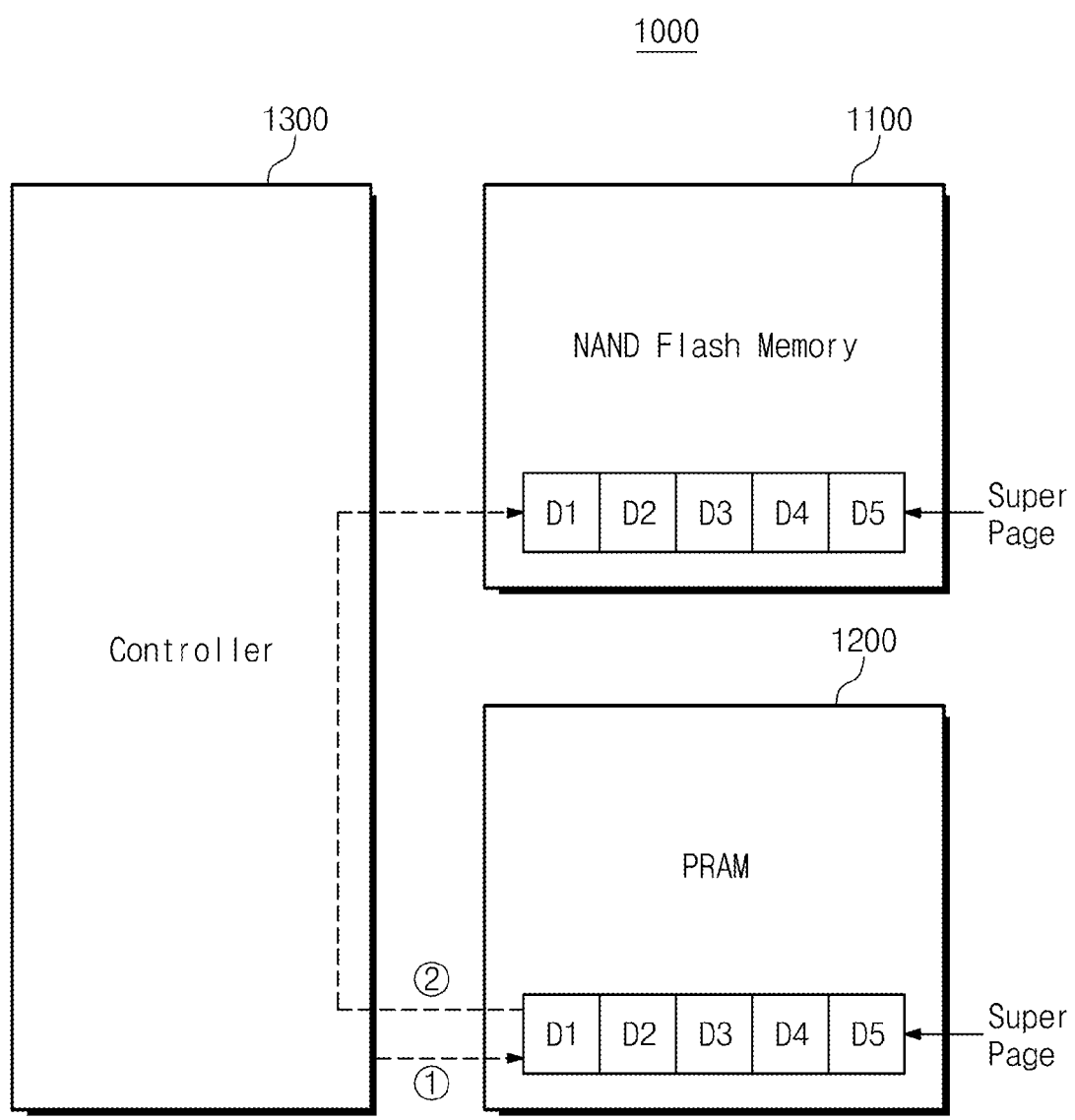
FIG. 11 is a diagram illustrating still another example of an operating method of FIG. 2 executed in a memory system according to an embodiment of the inventive concept.

FIG. 11 is a diagram illustrating still another example of an operating method in FIG. 2 executed in a memory system according to an embodiment of the inventive concept. It is assumed that a NAND flash memory 1100 has a program sequence described with reference to FIG. 5.

Referring to FIG. 11, at circle-1 data D1 to D5 may be accumulated at a phase change memory 1200. Each of data D1 to D5 may have a size smaller than a page. The data D1 to D5 may correspond to a super page. Since the data D1 to D5 corresponds to the super page, at circle-2 they may be programmed at a super page of the NAND flash memory 1100. For example, when one super page includes three pages, the data D1 to D5 may be dispersedly programmed at three pages.

Figure 12A:
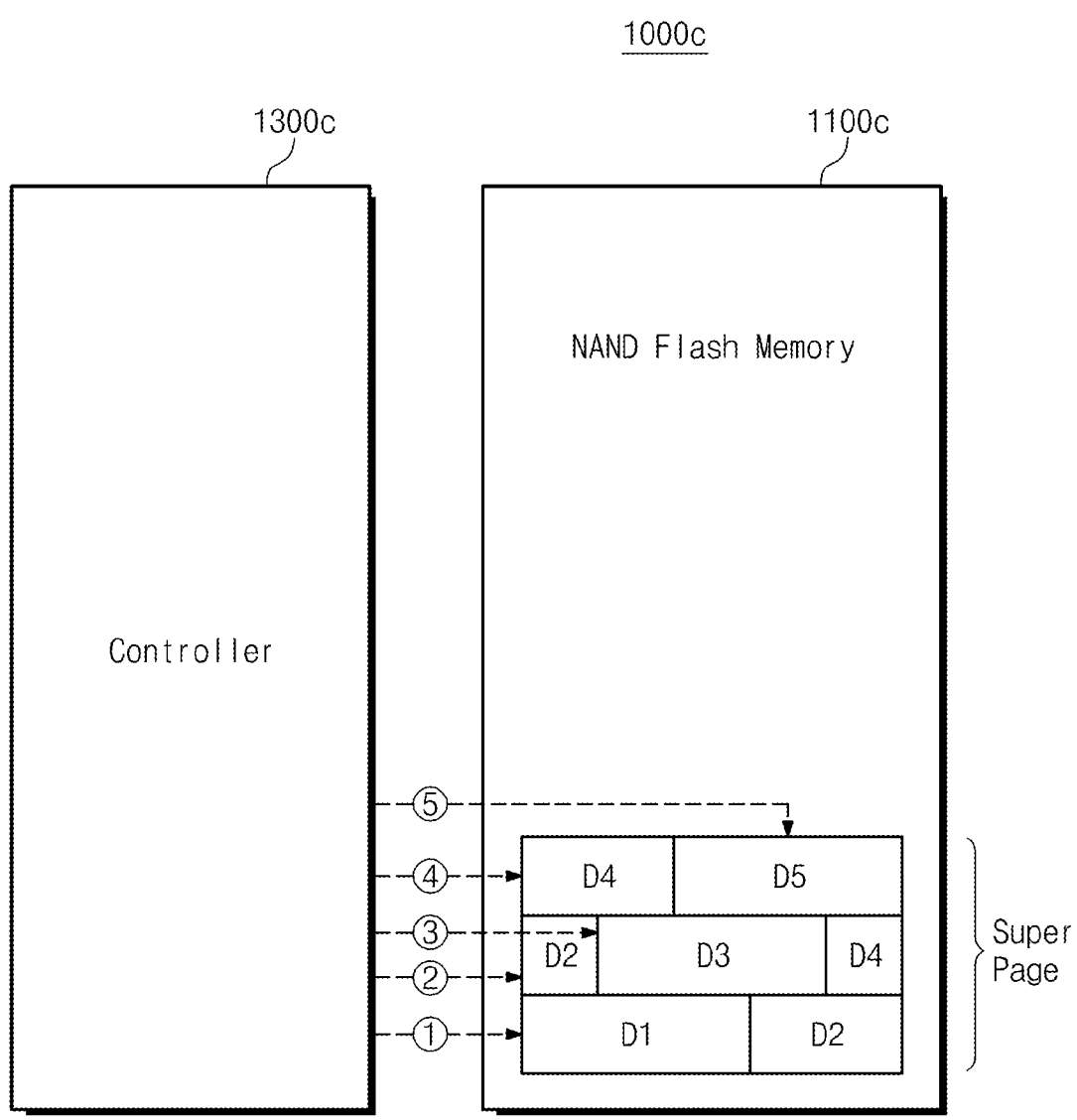
FIG. 12A is a diagram illustrating an operating method of FIG. 2 executed in a memory system having a NAND flash memory.

FIG. 12A is a diagram illustrating an operating method in FIG. 2 executed in a memory system having a NAND flash memory. Referring to FIG. 12A, a memory system 1000c may include a NAND flash memory 1100c and a controller 1300c.

The controller 1300c may program data received from an external device at the NAND flash memory 1100c. When data D1 is received, the controller 1100c at circle-1 of FIG. 12A may program the input data D1 at a page of the NAND flash memory 1100c.

When data D2 is received, the controller 1100c at circle-2 of FIG. 12A may program the input data D2 at the page, at which the data D1 is programmed, and a next page. When data D3 is received, the controller 1100c at circle-3 of FIG. 12A may program the input data D3 at the page, at which the data D2 is programmed. When data D4 is received, the controller 1100c at circle-4 of FIG. 12A may program the input data D4 at the page, at which the data D3 is programmed, and a next page. When data D5 is received, the controller 1100c at circle-5 of FIG. 12A may program the input data D5 at the page, at which the data D4 is programmed.

With embodiments of the inventive concept, a program operation may be executed after data D1 to D5 corresponding to a super page is received. Thus, a number of program (NOP) of each page may be '1'. However, as illustrated in FIG. 12A, if a phase change memory 1200 is not provided, a number of program (NOP) of each page may exceed '1'. In this case, data may be damaged due to program disturbance and the like. That is, with embodiments of the inventive concept, it is possible to prevent an error due to the number of program (NOP) from being generated.

Figure 12B:
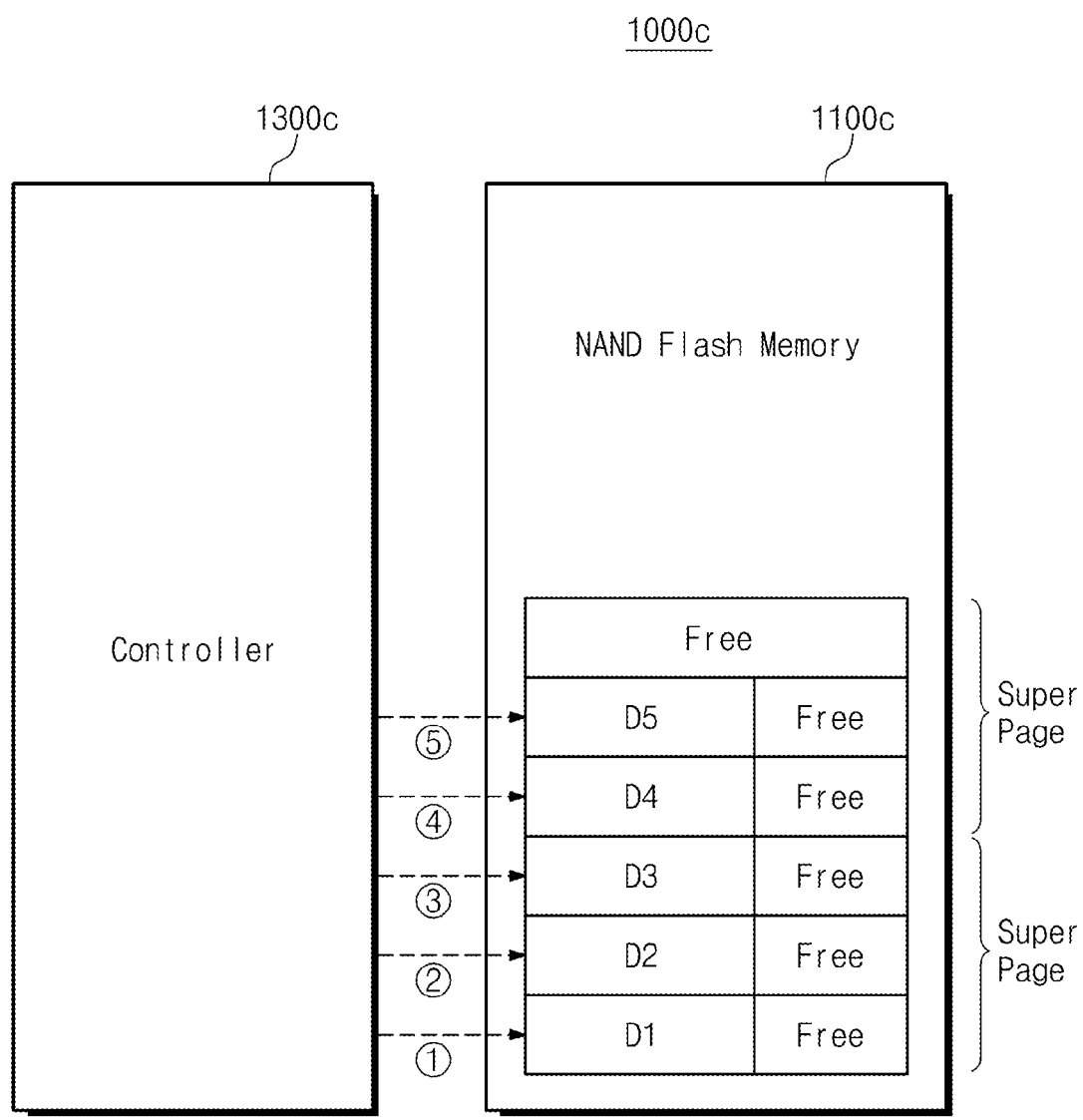
FIG. 12B is a diagram illustrating another example of of operating method in FIG. 2 executed in a memory system having a NAND flash memory.

FIG. 12B is a diagram illustrating another example of an operating method in FIG. 2 executed in a memory system having a NAND flash memory. Referring to FIG. 12B, a memory system 1000c may include a NAND flash memory 1100c and a controller 1300c.

The controller 1300c may program data received from an external device at the NAND flash memory 1100c. When data D1 is received, the controller 1100c at circle-1 of FIG. 12B may program the input data D1 at a page of the NAND flash memory 1100c. Afterwards, data D2 may be provided to the controller 1300c.

To reduce the number of program (NOP), no program operation may be performed with respect to a page experiencing a program operation. If the input data D1 is programmed at a page, data may not be programmed at the page. Thus, as represented by circle-2 of FIG. 12B, data D2 received after programming of the data D1 may be programmed at a page different from a page at which the data D1 is programmed. Likewise, as respectively represented by circle-3, circle-4 and circle-5 of FIG. 12B, data D3 to D5 may be programmed at different pages, respectively.

A size of each of data D1 to D5 may be smaller than that of a page. Thus, pages programmed with the data D1 to D5 may have free spaces, respectively. No data may be programmed at the free spaces of the pages. That is, if a phase change memory 1200 according to an embodiment of the inventive concept is not provided, the above-described free spaces of the NAND flash memory 1100c may increase, thus lowering the operating efficiency of the NAND flash memory 1100c and the memory system 1000c.

According to an embodiment of the inventive concept, data not corresponding to a super page, for example, data smaller in size than the super page may be accumulated at the phase change memory 1200. When the accumulated data corresponds to the super page, it may be programmed at the NAND flash memory 1100c. Thus, it is possible to prevent inefficiency due to limit of the number of program (NOP) of the NAND flash memory 1100c.

Figure 13:
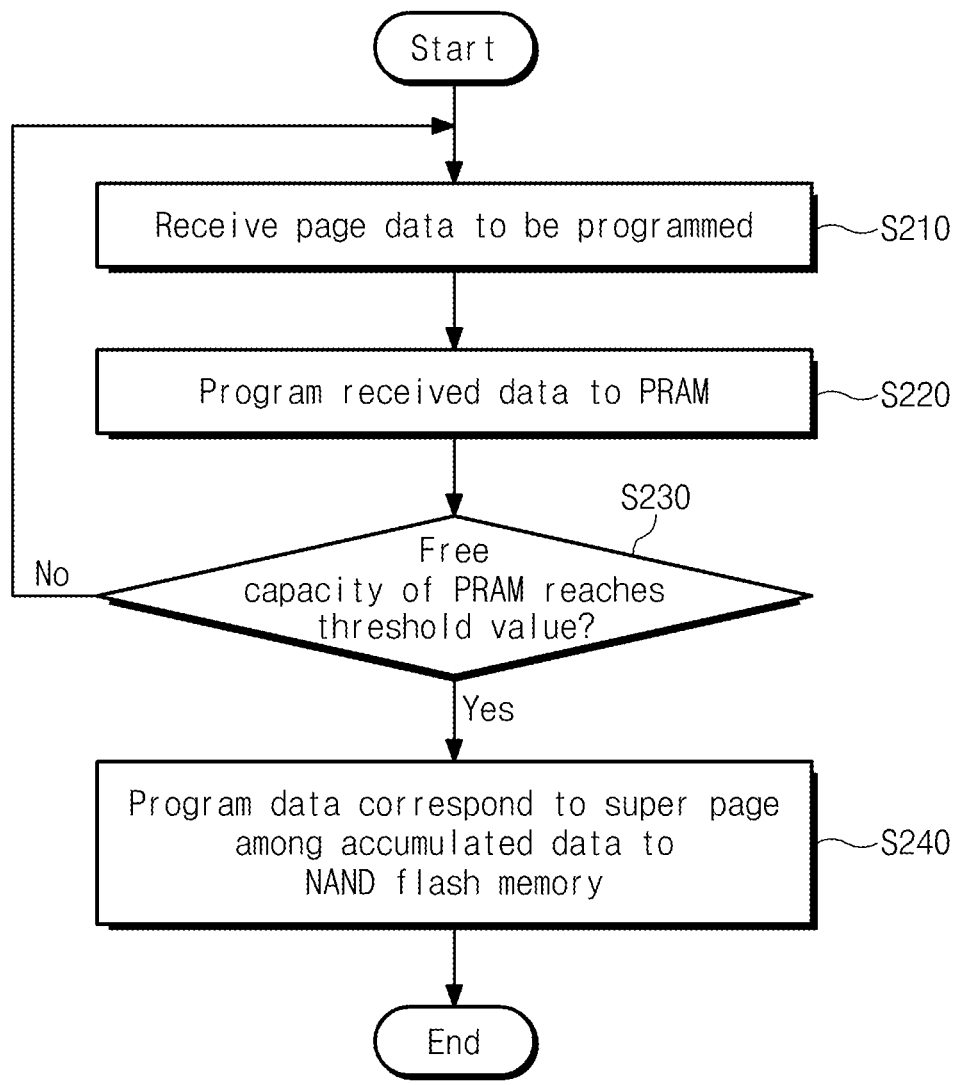
FIG. 13 is a flowchart illustrating an operating method of a memory system according to another embodiment of the inventive concept.

FIG. 13 is a flowchart illustrating an operating method of a memory system according to another embodiment of the inventive concept. Referring to FIGS. 1 and 13, in operation S210, data to be programmed may be received. In operation S220, page data may be programmed at a phase change memory 1200.

In operation S230, whether a free capacity of the phase change memory 1200 reaches a threshold value may be judged. For example, the controller 1300 may judge whether a free capacity of the phase change memory 1200 reaches a threshold value. The threshold value may be set to 5%, 10%, 15%, 20%, or the like of the entire capacity of the phase change memory 1200. When the free capacity of the phase change memory 1200 is judged to reach a threshold value, the method proceeds to operation S240. If not, the method returns to operation S210.

In operation S240, data, corresponding to a super page, from among data accumulated at the phase change memory 1200 may be programmed at a NAND flash memory 1100. For example, data, corresponding to one or more super pages, from among accumulated at the phase change memory 1200 may be programmed at the NAND flash memory 1100. All accumulated data, corresponding to a super page, from among data accumulated at the phase change memory 1200 can be programmed at the NAND flash memory 1100.

Figure 14:
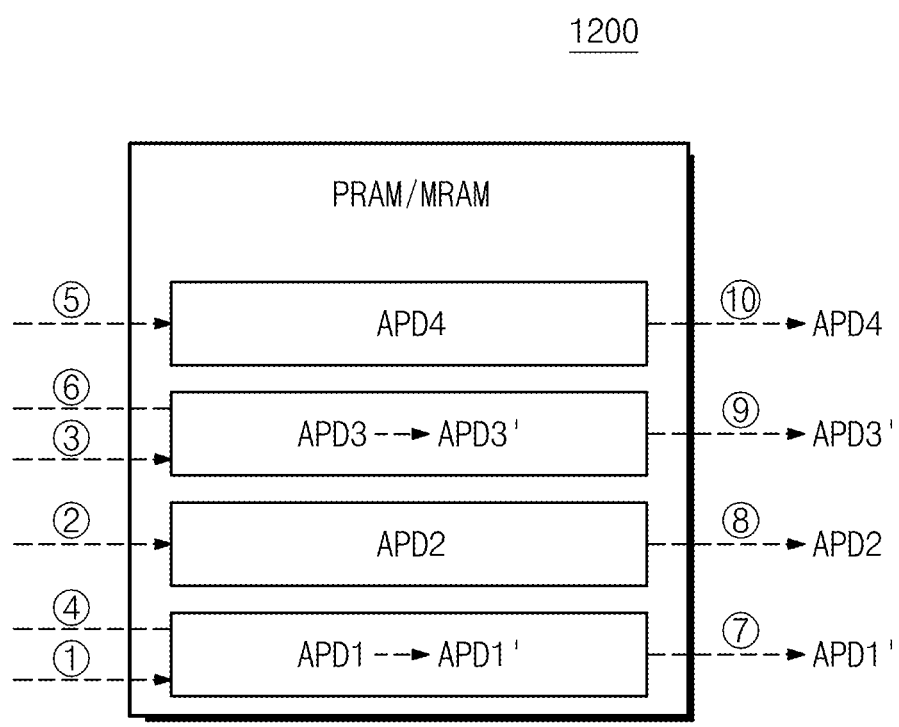
FIG. 14 is a diagram illustrating an operating method of FIG. 13 executed in a memory system according to embodiments of the inventive concept.

FIG. 14 is a diagram of the phase change memory 1200 to further describe the operating method shown in FIG. 13 executed in a memory system according to embodiments of the inventive concept. In FIG. 14, the encircled numbers 1~10 denote a sequence of page programming and page output operations of the phase change memory 1200. Referring to FIGS. 1, 13, and 14, pages of data APD1 to APD4 may be accumulated at a phase change memory 1200. Data stored at a memory system 1000 may be updated by an external host. Upon updating of data stored at a NAND flash memory 1100 having an erase-before-write characteristic, there may be required operations of reading data to be updated, updating the read data, programming the updated data, and erasing an area from which data to be updated is read. On the other hand, accumulated data APD1 and APD3 stored at the phase change memory 1200 being over-writable may be updated with new accumulated data APD1' and APD3' through an overwrite operation. Afterwards, the accumulated data APD1' and APD3' updated at the phase change memory 1200 may be programmed at the NAND flash memory 1100.

According to an embodiment of the inventive concept, page data may be accumulated at the phase change memory 1200 until a free capacity of the phase change memory 1200 reaches a threshold value. Thus, overhead may be reduced upon data updating of the memory system 1000.

In example embodiments, when page data accumulated at the phase change memory 1200 satisfies a threshold condition, it may be transferred to the NAND flash memory 1100 to be programmed. However, the inventive concept is not limited thereto. For example, when page data accumulated at the phase change memory 1200 and page data transferred to the controller 1300 from an external host satisfy a threshold condition, they may be transferred to the NAND flash memory 1100 to be programmed.

Figure 15:
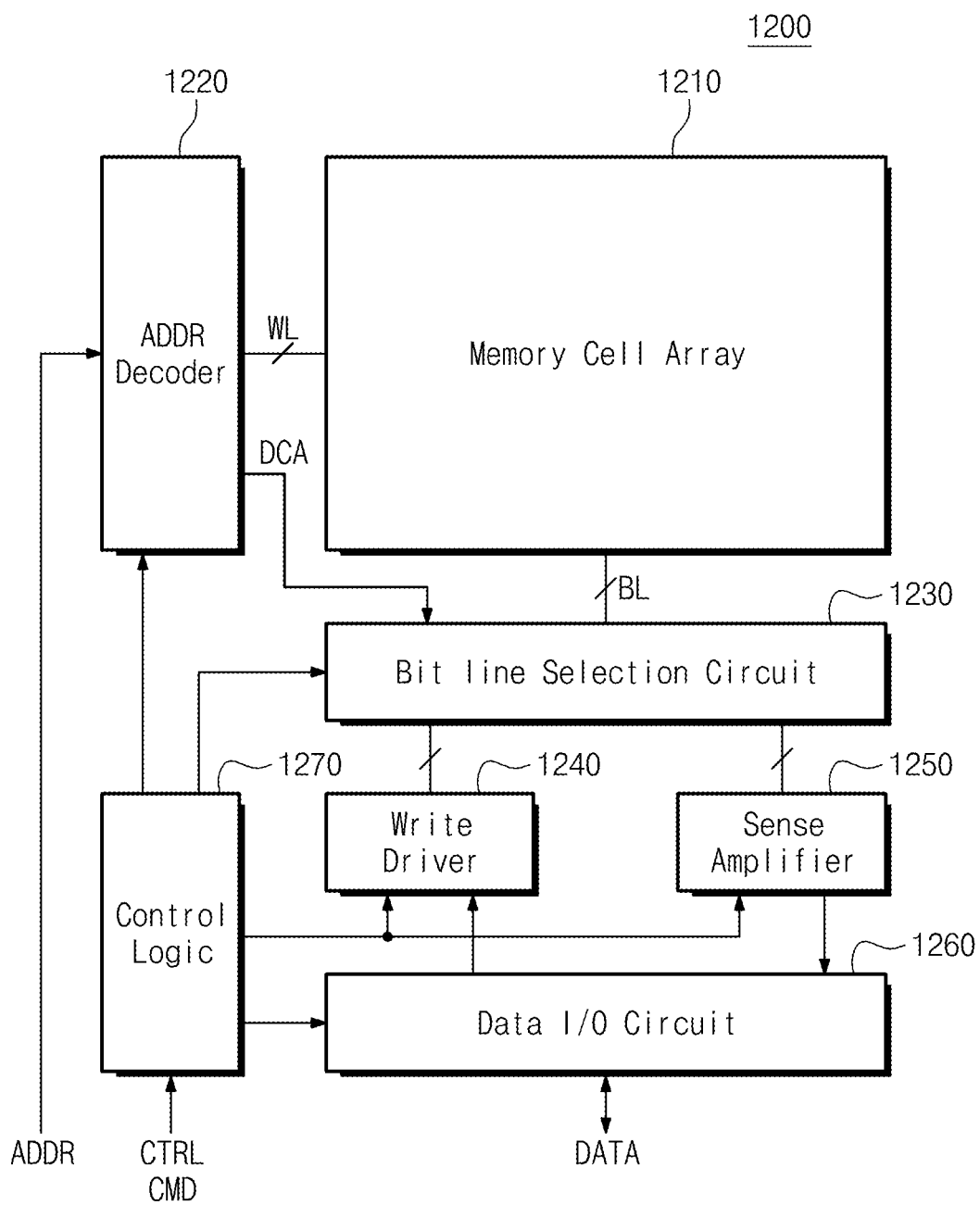
FIG. 15 is a block diagram schematically illustrating a phase change memory according to an embodiment of the inventive concept.

FIG. 15 is a block diagram schematically illustrating a phase change memory according to an embodiment of the inventive concept. Referring to FIG. 15, a phase change memory 1200 may include a memory cell array 1210, an address decoder 1220, a bit line selection circuit 1230, a write driver 1240, a sense amplifier 1250, a data input/output circuit 1260, and control logic 1270.

The memory cell array 1210 may be connected to the address decoder 1220 via word lines WL and to the bit line selection circuit 1230 via bit lines BL. The memory cell array 1210 may include a plurality of memory cells. In example embodiments, memory cells arranged in a row direction may be connected to the word lines WL, and memory cells arranged in a column direction may be connected to the bit lines BL. In example embodiments, each of the memory cells of the memory cell array 1210 may store one or more bits of data.

The address decoder 1220 may be connected to the memory cell array 1210 via the word lines WL. The address decoder 1220 may be configured to operate responsive to the control of the control logic 1270. The address decoder 1220 may receive an address ADDR from an external device.

The address decoder 1220 may be configured to decode a row address of the input address ADDR. Using the decoded row address, the address decoder 1220 may select the word lines WL. The address decoder 1220 may be configured to decode a column address of the input address ADDR. The decoded column address DCA may be provided to the bit line selection circuit 1230. In example embodiments, the address decoder 1220 may include constituent elements such as a row decoder, a column decoder, an address buffer, and the like.

The bit line selection circuit 1230 may be connected to the memory cell array 1210 through the bit lines BL and to the write driver 1240 and the sense amplifier 1250. The bit line selection circuit 1230 may operate responsive to the control of the control logic 1270. The bit line selection circuit 1230 may be configured to receive the decoded column address DCA from the address decoder 1220. Using the decoded column address DCA, the bit line selection circuit 1230 may select the bit lines BL.

At a program operation, the bit line selection circuit 1230 may connect the bit lines BL to the write driver 1240. At a read operation, the bit line selection circuit 1230 may connect the bit lines BL to the sense amplifier 1250.

The write driver 1240 may operate responsive to the control of the control logic 1270. The write driver 1240 may be configured to program memory cells defined by bit lines selected by the bit line selection circuit 1230 and a word line selected by the address decoder 1220. The write driver 1240 may generate a set current or a reset current according to data received from the data input/output circuit, and may output the set current or the reset current to the selected bit lines. The set current and reset current are described later with reference to FIGS. 16 and 17.

The sense amplifier 1250 may operate responsive to the control of the control logic 1270. The sense amplifier 1250 may be configured to read memory cells defined by bit lines selected by the bit line selection circuit 1230 and a word line selected by the address decoder 1220. The sense amplifier 1250 may read the memory cells by sensing currents flowing through the selected bit lines or voltages of the selected bit lines. The sense amplifier 1250 may output the read data to the data input/output circuit 1260.

The data input/output circuit 1260 may operate responsive to the control of the control logic 1270. The data input/output circuit 1260 may transfer externally received data to the write driver 1240 and output data provided from the sense amplifier 1250 to an external device.

The control logic 1270 may control an overall operation of the phase change memory 1200. The control logic 1270 may operate responsive to a command CMD and a control signal CTRL received from the external device.

The phase change memory 1200 may provide random access functionality. A physical address system of the phase change memory 1200 may be equal to a logical address system of an external host. Thus, a controller 1300 in FIG. 1 may not necessitate a device for translating a logical address of the external host into a physical address of the phase change memory 1200.

Figure 16:
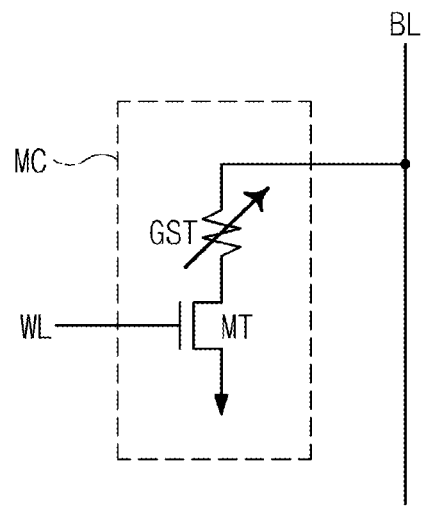
FIG. 16 is a diagram illustrating a memory cell of a phase change memory.

FIG. 16 is a diagram illustrating a memory cell of a phase change memory. Referring to FIG. 16, a memory cell MC may include a resistance variable element GST and a selection element. In this example, the selection element is a selection transistor MT. Also in this example, the resistance variable element GST may be connected to a bit line BL, and the selection transistor MT may be connected between the resistance variable element GST and a ground. Here, a gate of the selection transistor MT may be connected to a word line WL.

If a voltage is applied to the word line WL, the selection transistor MT may be turned on. At this time, the resistance variable element GST may be supplied with a current via the bit line BL.

The resistance variable element GST may include a phase change material. The phase change material may include a Ge—Sb—Te (GST) material whose resistance varies according to a temperature. The phase change material may have one of two states, that is, a crystal state and an amorphous state. The phase change material may be switched into a crystal state or an amorphous state according to a current supplied via the bit line BL, whereby the current results in Joule heating to thermally transition the state of the phase change material.

Figure 17:
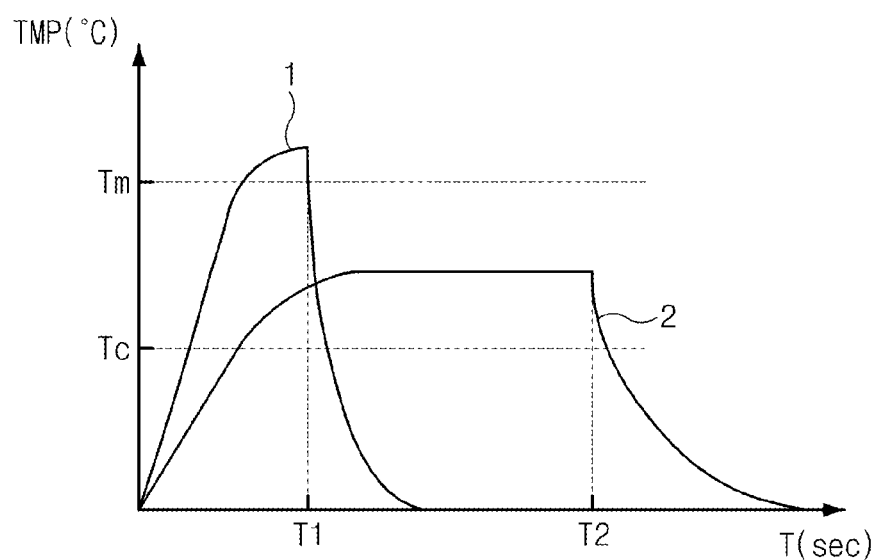
FIG. 17 is a graph illustrating characteristics of a phase change material.

FIG. 17 is a graph illustrating temperature (TMP(C.°)) versus time (T(sec)) characteristics of a phase change material during programming of the phase change material. In FIG. 17, a reference numeral 1 may indicate such a temperature condition that a phase change material is transitioned to an amorphous state, and a reference numeral 2 may indicate such a temperature condition that a phase change material is transitioned a crystal state.

Referring to FIGS. 16 and 17, a phase change material may be set to the amorphous state when it is heated at a temperature higher than a melting temperature Tm during a first time T1 and then is quickly quenching. The amorphous state may be referred to as a reset state, and may represent stored data of logic '1'.

The phase change material may be set to the crystal state when it is heated at a temperature lower than a melting temperature Tm and higher than a crystallization temperature Tc during a second time T2 which is longer than the first time T1, and followed by relatively slow quenching. The crystal state may be referred to as a set state, and may represent stored data of logic '0'.

The memory cell MC may have a resistance varies with a change in an amorphous volume of a phase change material. That is, the resistance of the memory cell MC may larger than that of the amorphous state (reset state) and smaller than that of the crystal state (set state).

Figure 18:
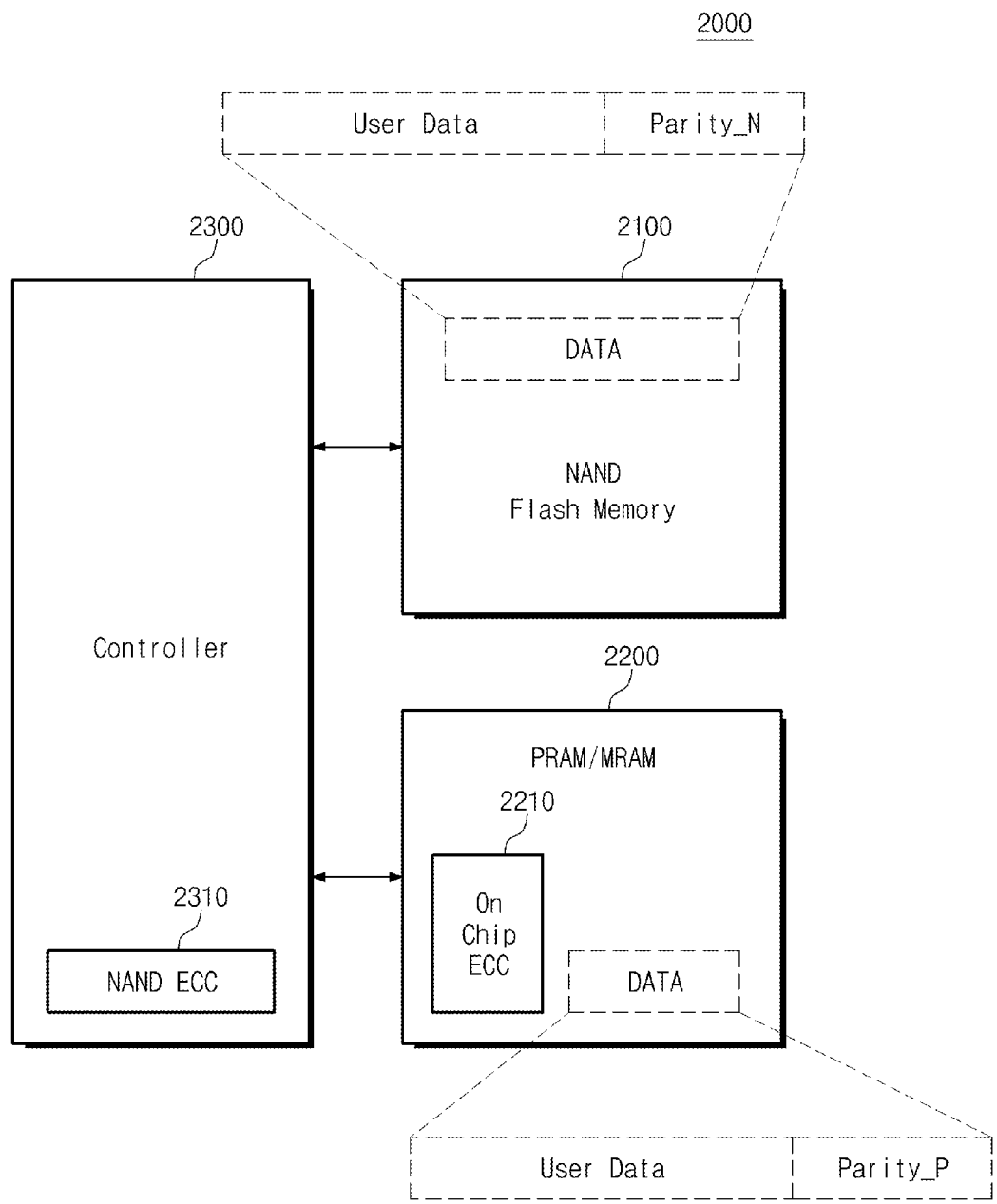
FIG. 18 is a block diagram schematically illustrating a memory system according to another embodiment of the inventive concept.

FIG. 18 is a block diagram schematically illustrating a memory system according to another embodiment of the inventive concept. Referring to FIG. 18, a memory system 2000 may include a NAND flash memory 2100, a phase change memory 2200, and a controller 2300. Compared with the memory system 1000 shown in FIG. 1, the phase change memory 2200 may include an on-chip error correcting code (ECC) block 2210, and the controller 2300 may include a NAND ECC block 2310.

In example embodiments, the on-chip ECC block 2210 may use a hamming code. The NAND ECC block 2310 a BCH (Bose-Chadhuri-Hocquenghem) code, an RS (Reed-Solomon) code, a turbo code, an LDPC (Low Density Parity Check) code, and the like.

When data is stored at the phase change memory 2200, the controller 2300 may not use the NAND ECC block 2310. The phase change memory 2200 may generate parity data Parity_P using the on-chip ECC block 2210. That is, data stored at the phase change memory 2200 may include user data and parity data Parity_P generated by the on-chip ECC block 2210.

When data is transferred to the NAND flash memory 2100 from the phase change memory 2200, the phase change memory 2200 may remove the parity data Parity_P using the on-chip ECC block 2210. The controller 2300 may generate parity data Parity_N using the NAND ECC block 2310. That is, data stored at the NAND flash memory 2100 may include user data and the parity data Parity_N generated by the NAND ECC block 2310.

When data is read from the NAND flash memory 2100, the controller 2300 may remove the parity data Parity_N using the NAND ECC block 2310.

Figure 19:
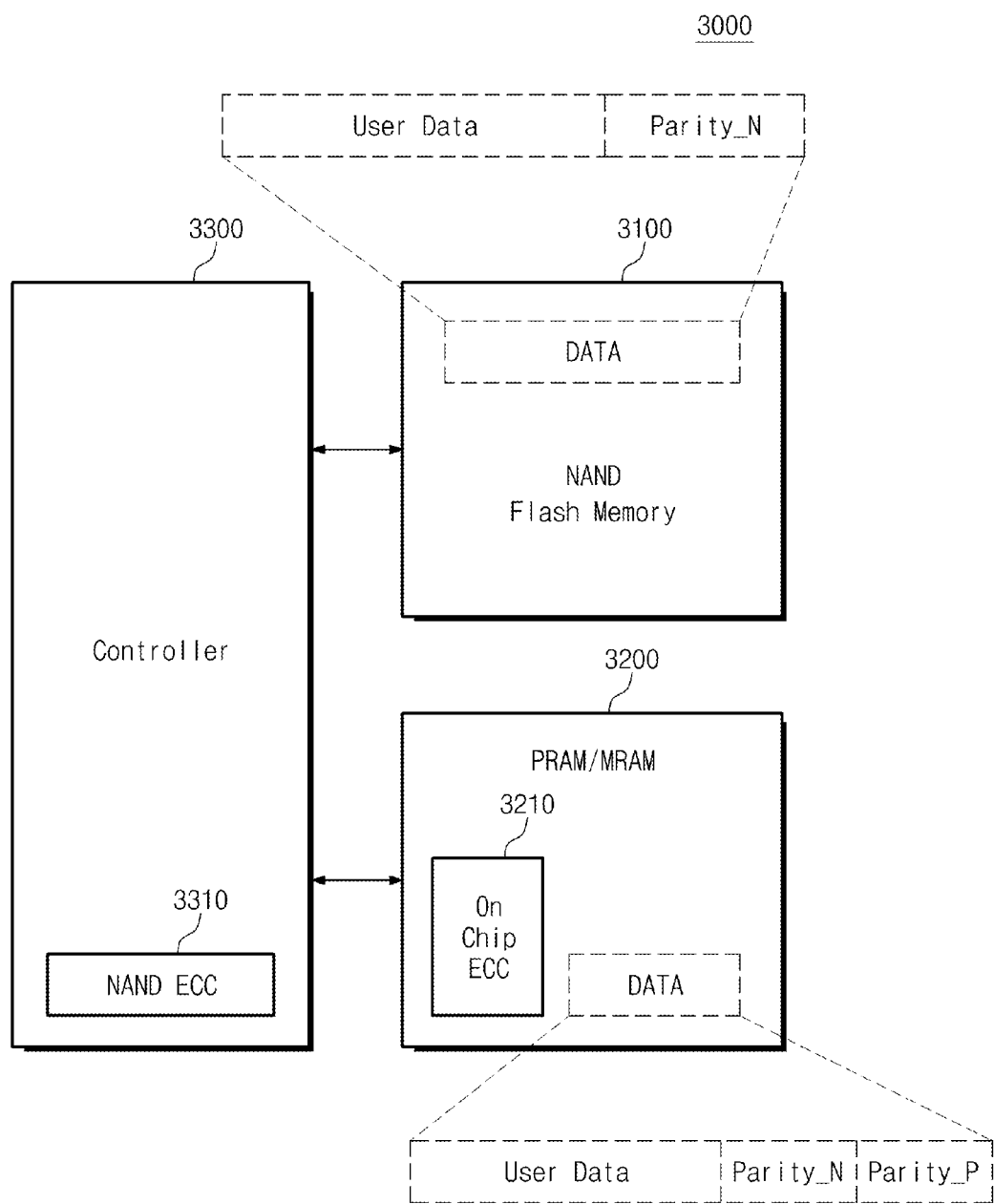
FIG. 19 is a block diagram schematically illustrating a memory system according to still another embodiment of the inventive concept.

FIG. 19 is a block diagram schematically illustrating a memory system according to still another embodiment of the inventive concept. Referring to FIG. 19, a memory system 3000 may include a NAND flash memory 3100, a phase change memory 3200, and a controller 3300. Compared with the memory system 1000 shown in FIG. 1, the phase change memory 3200 may include an on-chip error correcting code (ECC) block 3210, and the controller 3300 may include a NAND ECC block 3310.

When data is stored at the phase change memory 3200, the controller 3300 may generate parity data using the NAND ECC block 3310. The phase change memory 3200 may generate parity data Parity_P using the on-chip ECC block 3210. That is, data stored at the phase change memory 3200 may include user data, parity data Parity_N generated by the NAND ECC block 3310, and parity data Parity_P generated by the on-chip ECC block 3210.

When data is transferred to the NAND flash memory 3100 from the phase change memory 3200, the phase change memory 3200 may remove the parity data Parity_P using the on-chip ECC block 3210. The controller 3300 may not use the NAND ECC block 3310. That is, data stored at the NAND flash memory 3100 may include user data and the parity data Parity_N generated by the NAND ECC block 3310.

When data is read from the NAND flash memory 3100, the controller 3300 may remove the parity data Parity_N using the NAND ECC block 3310.

Figure 20:
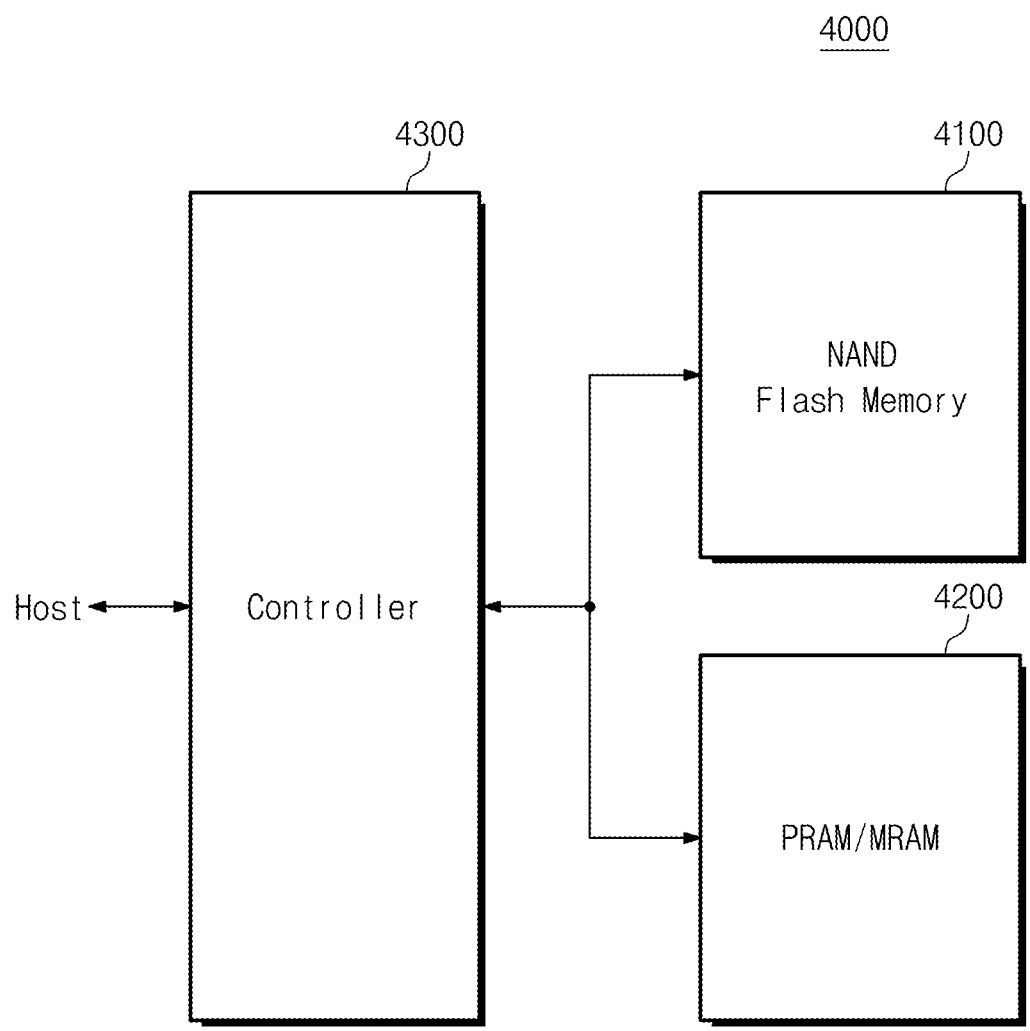
FIG. 20 is a block diagram schematically illustrating a memory system according to still another embodiment of the inventive concept.

FIG. 20 is a block diagram schematically illustrating a memory system according to still another embodiment of the inventive concept. Referring to FIG. 20, a memory system 4000 may include a NAND flash memory 4100, a phase change memory 4200, and a controller 4300. Compared with a memory system 1000 in FIG. 1, the controller 4300 may control the NAND flash memory 4100 and the phase change memory 4200 via a common bus. The NAND flash memory 4100 and the phase change memory 4200 may communicate with the controller 4300 using time division techniques.

Data accumulated at the phase change memory 4200 may be directly transferred to the NAND flash memory 4100 via the common bus without passing through the controller 4300.

Figure 21:
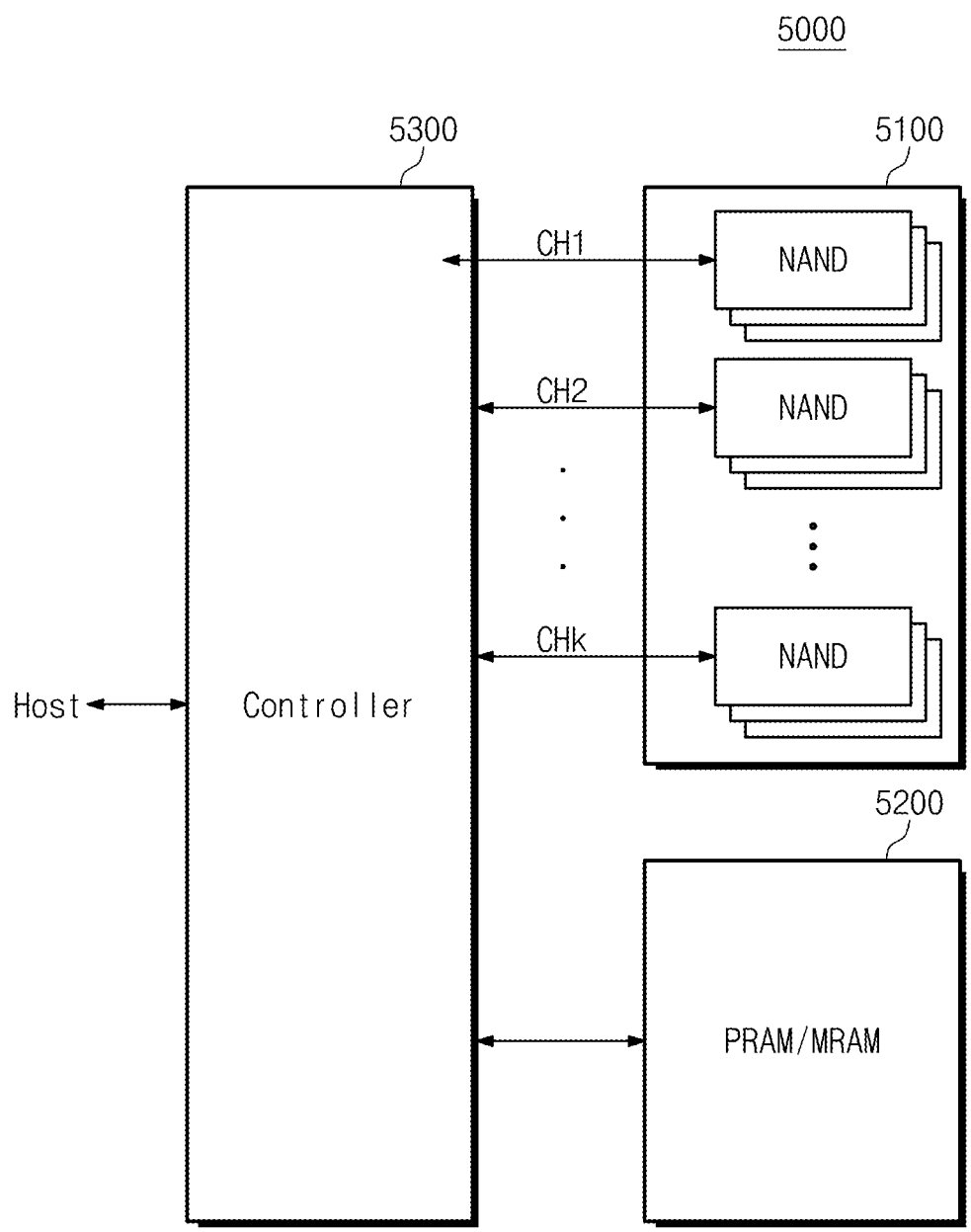
FIG. 21 is a block diagram schematically illustrating a memory system according to still another embodiment of the inventive concept.

FIG. 21 is a block diagram schematically illustrating a memory system according to still another embodiment of the inventive concept. Referring to FIG. 21, a memory system 5000 may include a NAND flash memory 5100, a phase change memory 5200, and a controller 5300. Compared with the memory system 1000 shown in FIG. 1, the NAND flash memory 5100 may communicate with the controller 5300 via a plurality of channels CH1 to CHk. Each channel may be connected with a plurality of NAND flash memory chips.

In example embodiments, as described with reference to FIG. 20, the NAND flash memory 5100 and the controller 5300 may be connected via a common bus, and the plurality of channels CH1 to CHk may occupy the common bus using time division techniques.

In example embodiments, as described with reference to FIG. 20, the NAND flash memory 5100 and the phase change memory 5200 may be connected with the controller 5300 via a common bus, and may communicate with the controller 5300 using time division techniques.

Figure 22:
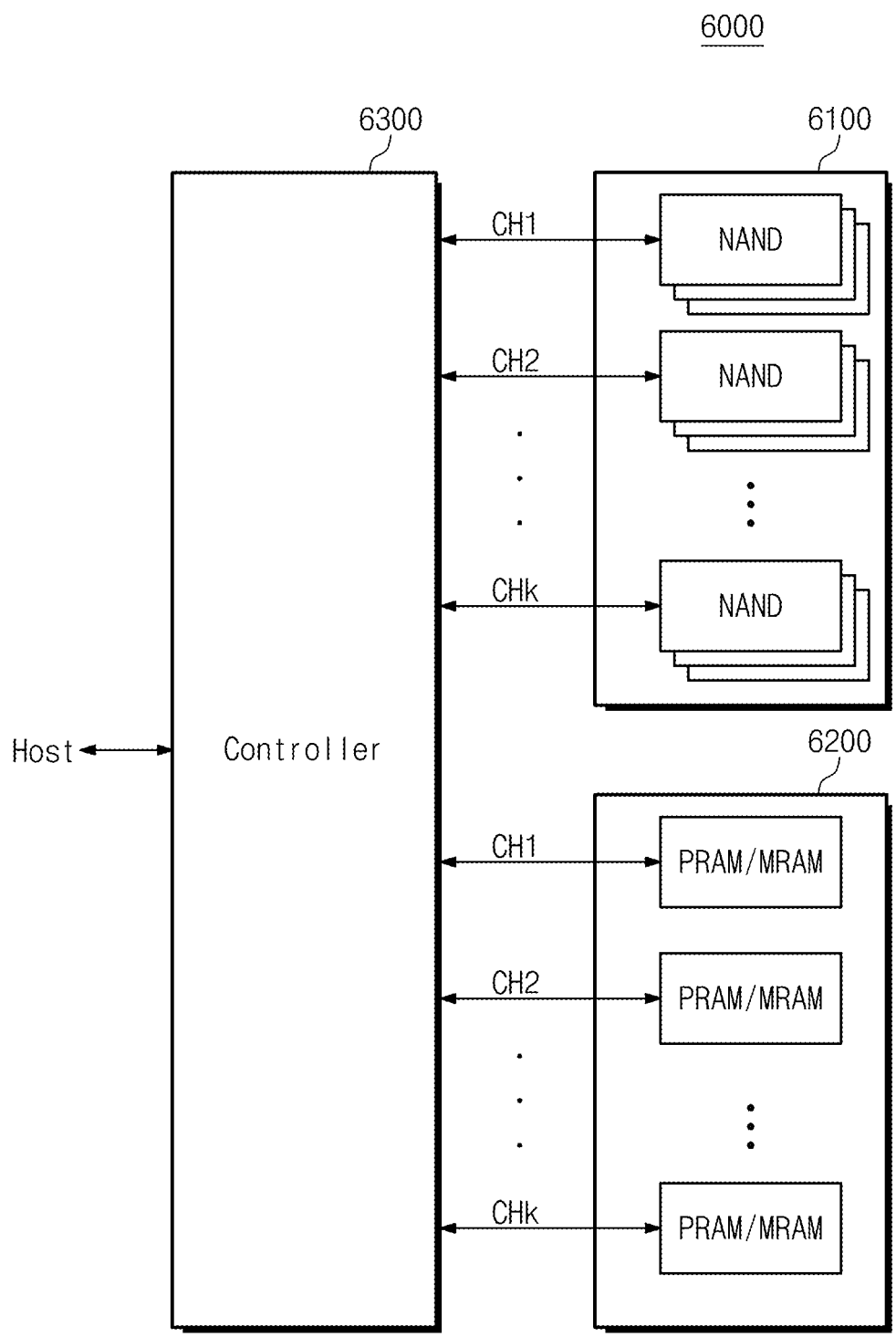
FIG. 22 is a block diagram schematically illustrating a memory system according to still another embodiment of the inventive concept.

FIG. 22 is a block diagram schematically illustrating a memory system according to still another embodiment of the inventive concept. Referring to FIG. 21, a memory system 6000 may include a NAND flash memory 6100, a phase change memory 6200, and a controller 6300. Compared with the memory system 1000 shown in FIG. 1, the NAND flash memory 6100 may communicate with the controller 5300 via a plurality of channels CH1 to CHk. Each channel may be connected with a plurality of NAND flash memory chips. The phase change memory 6200 may communicate with the controller 6300 via the plurality of channels CH1 to CHk. A phase change memory chip may be connected to each channel.

A phase change memory connected with each channel may correspond to a plurality of NAND flash memory chips connected with a channel. Data to be programmed at NAND flash memory chips connected with one channel may be programmed at a phase change memory chip connected with a corresponding channel.

In example embodiments, as described with reference to FIG. 20, the NAND flash memory 6100 and the controller 6300 may be connected via a common bus, and the plurality of channels CH1 to CHk may occupy the common bus using time division techniques.

In example embodiments, as described with reference to FIG. 20, the NAND flash memory 6100 and the phase change memory 6200 may be connected with the controller 6300 via a common bus, and may communicate with the controller 6300 using time division techniques.

Figure 23:
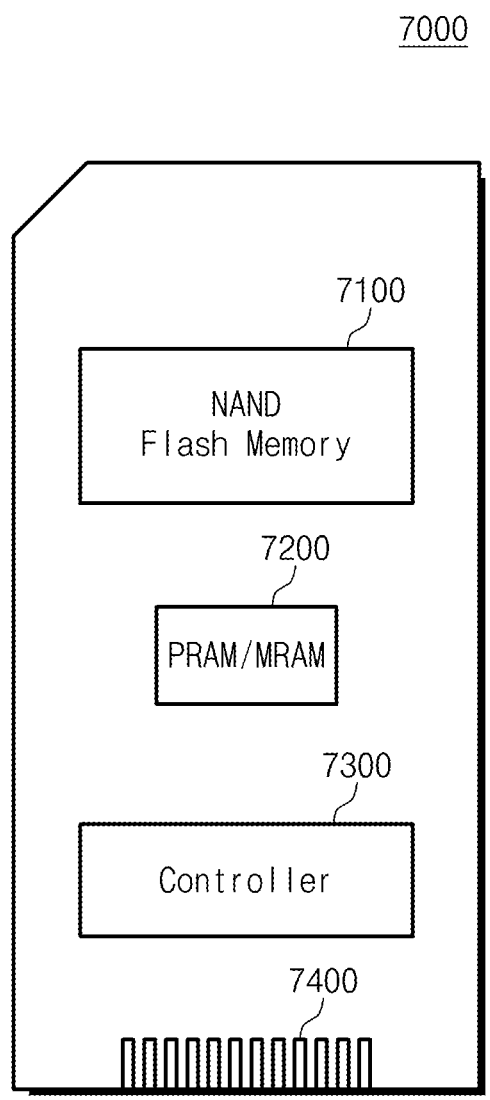
FIG. 23 is a diagram illustrating a memory card according to an embodiment of the inventive concept.

FIG. 23 is a diagram illustrating a memory card according to an embodiment of the inventive concept. Referring to FIG. 23, a memory card 7000 may include a NAND flash memory 7100, a phase change memory 7200, a controller 7300, and a connector 7400.

The controller 7300 may accumulate data at the phase change memory 7200. When data accumulated at the phase change memory 7200 corresponds to a super page, the controller 7300 may program the accumulated data in the NAND flash memory 7100.

The memory card 7000 may be formed of memory cards such as a PC (PCMCIA) card, a CF card, an SM (or, SMC) card, a memory stick, a multimedia card (MMC, RS-MMC, MMCmicro), a security card (SD, miniSD, microSD, SDHC), a universal flash storage (UFS) device, and the like.

Figure 24:
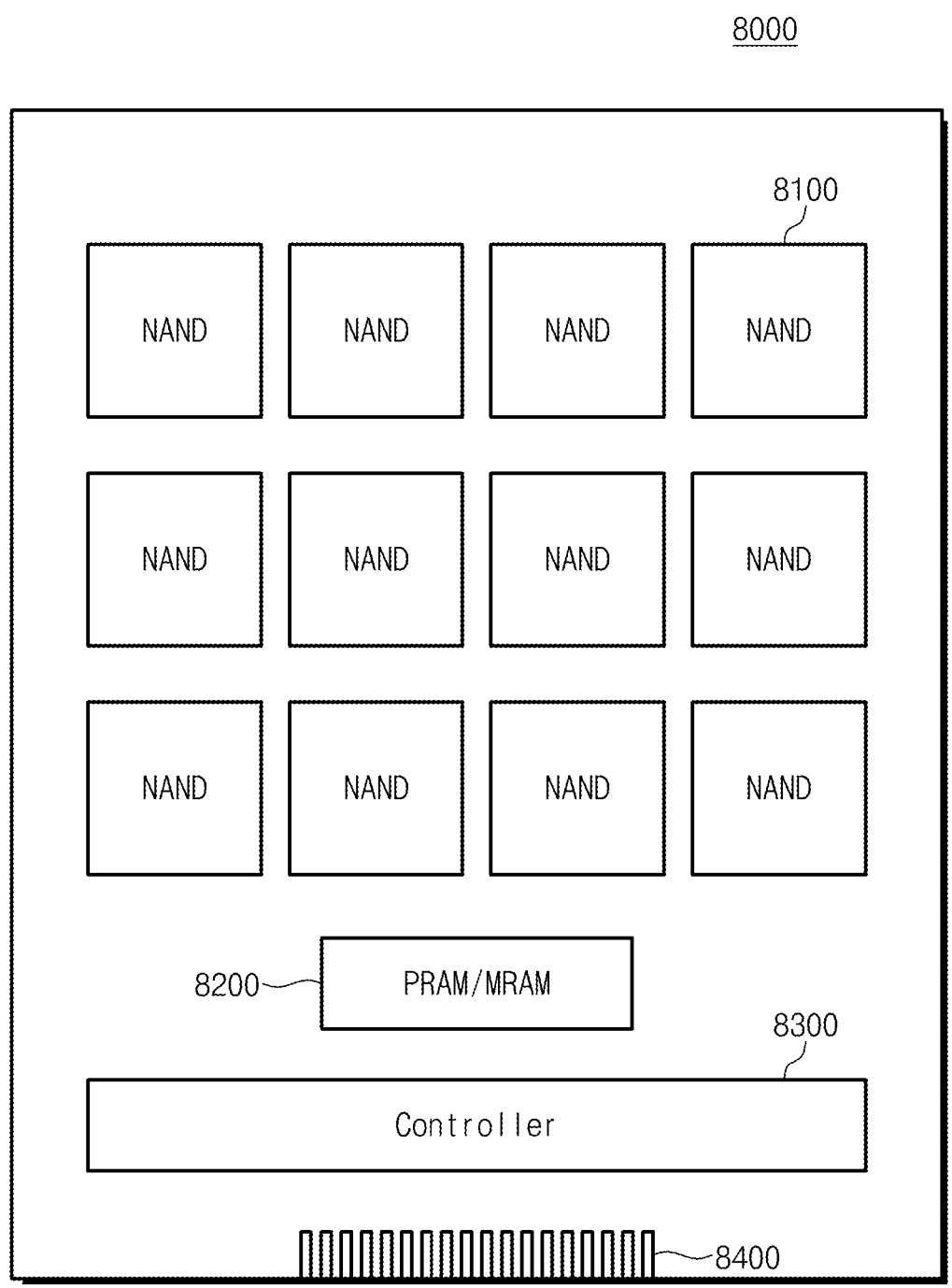
FIG. 24 is a diagram illustrating a solid state drive according to an embodiment of the inventive concept.

FIG. 24 is a diagram illustrating a solid state drive according to an embodiment of the inventive concept. Referring to FIG. 24, a solid state drive 8000 may include a plurality of NAND flash memory 8100, a phase change memory 8200, a controller 8300, and a connector 8400.

The controller 8300 may accumulate data at the phase change memory 8200. When data accumulated at the phase change memory 8200 corresponds to a super page, the controller 8300 may program the accumulated data in the NAND flash memory 8100.

Figure 25:
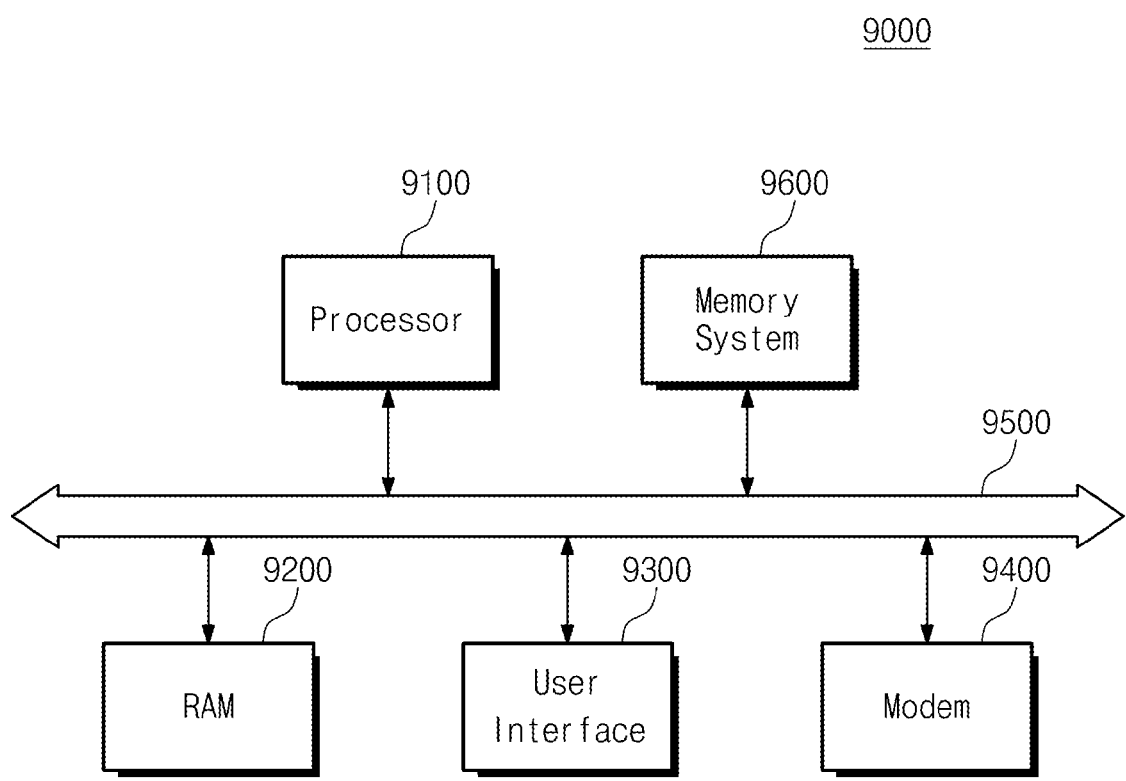
FIG. 25 is a block diagram illustrating a computing system according to an embodiment of the inventive concept.

FIG. 25 is a block diagram illustrating a computing system according to an embodiment of the inventive concept. Referring to FIG. 25, a computing system 9000 may include a central processing unit 9100, a RAM 9200, a user interface 9300, a modem 9400, a system bus 9500, and a memory system 9600.

The memory system 9600 may be connected electrically with the elements 9100 to 9400 via the system bus 8500. Data provided via the user interface 9300 or processed by the central processing unit 9100 may be stored in the memory system 9600.

The memory system 9600 may be one of memory systems 1000 to 6000 described with reference to FIGS. 1 and 18 to 22.

An embodiment of the inventive concept is described with respect to memory systems which include a phase change memory and a NAND flash memory. However, as previously mentioned, the inventive concept is not limited thereto. The inventive concept may be applied to a memory system including a NAND flash memory and other types of variable resistance memories such as MRAM, FeRAM, ReRAM, and the like. The resistance-variable memory may comply with a NAND sequence.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A storage device comprising:
   a variable resistance memory;
   a flash memory including a plurality of memory cells connected to a plurality of word lines; and
   a controller configured to receive data from an external device and program the received data in the variable resistance memory or the flash memory according to a quantity of data to be programmed in the flash memory,
   wherein the controller is configured to read from the variable resistance memory and program the read data in the flash memory, when the quantity of data accumulated in the variable resistance memory corresponds to a super page of data.

2. The storage device of claim 1, wherein the controller is configured to program the received data from the external device in the flash memory when the received data corresponds to the super page of data.

3. The storage device of claim 1, wherein the controller is configured to program the received data from the external device in the variable resistance memory when the received data does not correspond to a super page of data.

4. The storage device of claim 1, the super page of data is an entirety of data that is programmable in memory cells connected to a same word line of the flash memory.

5. The storage device of claim 4, wherein two or more bits of data are programmable in each of the memory cells connected to the same word line of the flash memory, and wherein the super page of data includes two or more bits being programmed at each of the memory cells connected to the same word line.

6. The storage device of claim 5, wherein the flash memory includes adjacent memory cells connected to a word line adjacent the same word line, and wherein the super page of data further includes at least one bit being programmed at each of the adjacent memory cells.

7. The storage device of claim 6, wherein a program operation is performed in sequence with respect to the same word line and the adjacent word line; and wherein the super page of data further comprises first data being programmed at the memory cells connected to the same word line and second data being programmed at the adjacent memory cells connected to the adjacent word line, the first and second data being required until programming of the memory cells connected to the same word line is completed.

8. The storage device of claim 4, wherein the controller generates first data by adding a first parity to the received data and programs the first data at the resistance variable memory.

9. The storage device of claim 8, wherein the resistance variable memory generates second data by adding a second parity to the first data and programs the second data.

10. The storage device of claim 9, wherein the resistance variable memory removes the second parity from accumulated data of the second data and programs the data, from which the second parity is removed, in the flash memory.

11. The storage device of claim 1, wherein the variable resistance memory is a PRAM.

12. The storage device of claim 1, wherein the flash memory comprises a three-dimensional memory array.

13. A storage device comprising:
a variable resistance memory;
a flash memory including a plurality of memory cells connected to a plurality of word lines; and
a controller configured to receive data from an external device, program the received data in the variable resistance memory when the received data does not correspond to a super page of data, and program the received data in the flash memory when the received data corresponds to the super page of data,
wherein the controller is configured to, when data accumulated in the variable resistance memory corresponds to the super page of data, read the data accumulated from the variable resistance memory and program the read data in the flash memory.

14. The storage device of claim 13, wherein the super page of data is an entirety of data that is programmable in memory cells connected to a same word line of the flash memory.

15. The storage device of claim 13, wherein the controller generates first data by adding a first parity to the received data and programs the first data in the resistance variable memory.

16. The storage device of claim 13, wherein the variable resistance memory is a PRAM.

17. The storage device of claim 13, wherein the resistance variable memory is a random access memory having overwrite functionality.

18. The storage device of claim 13, wherein the flash memory comprises a three-dimensional memory array.

19. A storage device comprising:
a variable resistance memory;
a plurality of flash memories each including a plurality of memory cells connected to a plurality of word lines; and
a controller configured to receive data from an external device, program the received data in the variable resistance memory when the received data does not correspond to a super page of data, and program the received data in a selected flash memory among the plurality of flash memories when the received data corresponds to the super page of data,
wherein the controller is configured to, when data accumulated in the variable resistance memory corresponds to the super page, read the data accumulated from the variable resistance memory and program the read data in the selected flash memory.

20. The storage device of claim 19, wherein the storage device is a solid state drive.

* * * * *